United States Patent
Hsu

(10) Patent No.: US 11,881,453 B2
(45) Date of Patent: Jan. 23, 2024

(54) METHOD FOR PREPARING A SEMICONDUCTOR DEVICE WITH INTERCONNECT PART

(71) Applicant: NANYA TECHNOLOGY CORPORATION, New Taipei (TW)

(72) Inventor: Chia-Hsiang Hsu, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 18/124,757

(22) Filed: Mar. 22, 2023

(65) Prior Publication Data

US 2023/0223340 A1 Jul. 13, 2023

Related U.S. Application Data

(62) Division of application No. 17/345,871, filed on Jun. 11, 2021, now Pat. No. 11,742,286.

(51) Int. Cl.

| H01L 23/528 | (2006.01) |
|---|---|
| H01L 23/535 | (2006.01) |
| H01L 21/768 | (2006.01) |
| H01L 23/532 | (2006.01) |
| H01L 23/522 | (2006.01) |
| H01L 29/417 | (2006.01) |
| H01L 29/66 | (2006.01) |
| H01L 23/00 | (2006.01) |
| H01L 27/088 | (2006.01) |
| H01L 27/12 | (2006.01) |

(52) U.S. Cl.
CPC ........ *H01L 23/528* (2013.01); *H01L 21/7682* (2013.01); *H01L 21/76807* (2013.01); *H01L 21/76828* (2013.01); *H01L 21/76895* (2013.01); *H01L 23/5226* (2013.01); *H01L 23/535* (2013.01); *H01L 23/5329* (2013.01); *H01L 29/41791* (2013.01); *H01L 29/66795* (2013.01); *H01L 21/76816* (2013.01); *H01L 24/33* (2013.01); *H01L 27/0886* (2013.01); *H01L 27/1211* (2013.01)

(58) Field of Classification Search
CPC ............ H01L 23/528; H01L 21/76807; H01L 21/7682; H01L 21/76828; H01L 21/76895; H01L 23/5226; H01L 23/5329; H01L 23/535; H01L 29/41791; H01L 29/66795; H01L 21/76816; H01L 24/33; H01L 21/768; H01L 29/41766; H01L 27/1211; H01L 27/0886
See application file for complete search history.

(56) References Cited

U.S. PATENT DOCUMENTS

| 2004/0130027 | A1* | 7/2004 | Chen | H01L 23/5222 |
| | | | | 257/758 |
| 2019/0157310 | A1* | 5/2019 | Glass | H01L 27/0886 |
| 2020/0020684 | A1* | 1/2020 | Chen | H01L 24/33 |

* cited by examiner

*Primary Examiner* — Patricia D Valenzuela
(74) *Attorney, Agent, or Firm* — Xuan Zhang

(57) ABSTRACT

The present disclosure provides a method for preparing a semiconductor device. The method includes forming a sacrificial source/drain structure over a first carrier substrate; forming a redistribution structure over the sacrificial source/drain structure; attaching the redistribution structure to a second carrier substrate; removing the first carrier substrate after the redistribution structure is attached to the second carrier substrate; replacing the sacrificial source/drain structure with a first source/drain structure; forming a backside contact over and electrically connected to the first source/drain structure; and forming an interconnect part over the backside contact.

6 Claims, 29 Drawing Sheets

METHOD FOR PREPARING A SEMICONDUCTOR DEVICE WITH INTERCONNECT PART

CROSS-REFERENCE TO RELATED APPLICATION

This application is a divisional application of U.S. Non-Provisional Application Ser. No. 17/345,871 filed 11 Jun. 2021, which is incorporated herein by reference in its entirety.

TECHNICAL FIELD

The present disclosure relates to a method for preparing a semiconductor device, and more particularly, to a method for preparing a semiconductor device with an interconnect part.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, and the fabrication cost and time may be increased due to additional process steps. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first source/drain structure disposed over a carrier substrate, and a backside contact disposed over and electrically connected to the first source/drain structure. The semiconductor device also includes an interconnect part disposed over the backside contact. The interconnect part includes a lower redistribution layer electrically connected to the backside contact, and an upper redistribution layer disposed over the lower redistribution layer. The interconnect part also includes an interconnect frame disposed between and electrically connected to the lower redistribution layer and the upper redistribution layer. The interconnect part further includes a passivation structure surrounding the interconnect frame.

In an embodiment, the passivation structure is sandwiched between the lower redistribution layer and the upper redistribution layer. In an embodiment, the interconnect part further includes a dielectric structure sandwiched between the lower redistribution layer and the upper redistribution layer, wherein the interconnect frame is separated from the passivation structure by the dielectric structure. In an embodiment, the interconnect frame of the interconnect part includes a first via portion vertically extending through a lower portion of the dielectric structure, a second via portion vertically extending through an upper portion of the dielectric structure, and a line portion horizontally extending between the first via portion and the second via portion, wherein the first via portion and the second via portion are electrically connected by the line portion.

In an embodiment, the semiconductor device further includes a second source/drain structure disposed between the interconnect part and the carrier substrate, and a frontside contact disposed between the second source/drain structure and the carrier substrate, wherein the second source/drain structure is electrically connected to the carrier substrate through the frontside contact. In an embodiment, the semiconductor device further includes a redistribution structure disposed between the backside contact and the lower redistribution layer of the interconnect part, wherein the first source/drain structure is electrically connected to the lower redistribution layer through the redistribution structure, and the second source/drain structure is electrically isolated from the redistribution structure. In an embodiment, a top surface of the first source/drain structure is higher than a top surface of the second source/drain structure.

In another embodiment of the present disclosure, a semiconductor device is provided. The semiconductor device includes a first source/drain structure disposed over a carrier substrate, and a backside contact disposed over and electrically connected to the first source/drain structure. The semiconductor device also includes an interconnect part disposed over the backside contact. The interconnect part includes a lower redistribution layer electrically connected to the backside contact, and an upper redistribution layer disposed over the lower redistribution layer. The interconnect part also includes a first interconnect conductor and a second interconnect conductor extending in parallel between the lower redistribution layer and the upper redistribution layer. The lower redistribution layer and the upper redistribution layer are electrically connected by the first interconnect conductor and the second interconnect conductor. The interconnect part further includes a first passivation liner and a second passivation liner surrounding the first interconnect conductor and the second interconnect conductor, respectively.

In an embodiment, the first passivation liner and the second passivation liner are in direct contact with the lower redistribution layer and the upper redistribution layer. In an embodiment, the first passivation liner and the second passivation liner have an air gap therebetween. In an embodiment, each of the first passivation liner and the second passivation liner is surrounded by a portion of an air gap structure. In an embodiment, the first interconnect conductor and the second interconnect conductor are separated from the air gap structure by the first passivation liner and the second passivation liner, respectively.

In an embodiment, the semiconductor device further includes a second source/drain structure disposed between the interconnect part and the carrier substrate, and a frontside contact disposed between the second source/drain structure and the carrier substrate, wherein the second source/drain structure is electrically connected to the carrier substrate through the frontside contact. In an embodiment, the semiconductor device further includes a dielectric layer disposed between the carrier substrate and the interconnect part, wherein the first source/drain structure and the second source/drain structure are disposed in the dielectric layer, and wherein a portion of the second source/drain structure extends to cover a top surface of the dielectric layer.

In yet another embodiment of the present disclosure, a method for preparing a semiconductor device is provided. The method includes forming a sacrificial source/drain structure over a first carrier substrate, and forming a redistribution structure over the sacrificial source/drain structure. The method also includes attaching the redistribution structure to a second carrier substrate, and removing the first carrier substrate after the redistribution structure is attached to the second carrier substrate. The method further includes replacing the sacrificial source/drain structure with a first source/drain structure, and forming a backside contact over and electrically connected to the first source/drain structure. In addition, the method includes forming an interconnect part over the backside contact. The step of forming the interconnect part includes forming a lower redistribution layer electrically connected to the backside contact, forming an interconnect structure over and electrically connected to the lower redistribution layer, and forming an upper redistribution layer over and electrically connected to the interconnect structure.

In an embodiment, the method further includes forming a second source/drain structure over the first carrier substrate, and forming a frontside contact over and electrically connected to the second source/drain structure. In addition, the method includes forming the redistribution structure over and electrically connected to the frontside contact. In an embodiment, the second source/drain structure is electrically connected to the second carrier substrate through the frontside contact. In an embodiment, the step of forming the interconnect structure of the interconnect part includes forming a passivation structure and a dielectric structure over the lower redistribution layer, and forming an interconnect frame in the dielectric structure. The dielectric structure is surrounded by the passivation structure.

In an embodiment, the step of forming the interconnect structure of the interconnect part includes forming an energy removable layer over the lower redistribution layer, and etching the energy removable layer to form a first opening and a second opening exposing the lower redistribution layer. In addition, the method includes forming a first passivation liner and a second passivation liner on sidewalls of the first opening and sidewalls of the second opening, respectively, and forming a first interconnect conductor in the first opening and surrounded by the first passivation liner and a second interconnect conductor in the second opening and surrounded by the second passivation liner. In an embodiment, the method further includes performing a heat treatment process to transform the energy removable layer into an air gap structure after the upper redistribution layer is formed.

Embodiments of a semiconductor device and method for preparing the same are provided in the disclosure. In some embodiments, the semiconductor device includes a backside contact disposed over and electrically connected to a source/drain structure, and an interconnect part disposed over and electrically connected to the backside contact. In some embodiments, the interconnect part includes an upper redistribution layer disposed over a lower redistribution layer, and an interconnect structure disposed between and electrically connected to the lower redistribution layer and the upper redistribution layer. By forming the interconnect part over the backside contact, the back-end-of-line (BEOL) routing is simplified. Accordingly, a modular design for implementing the interconnect part and the backside contact is achieved. In addition, the method for preparing the semiconductor device is simple and the fabrication cost and time of the semiconductor device is significantly reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
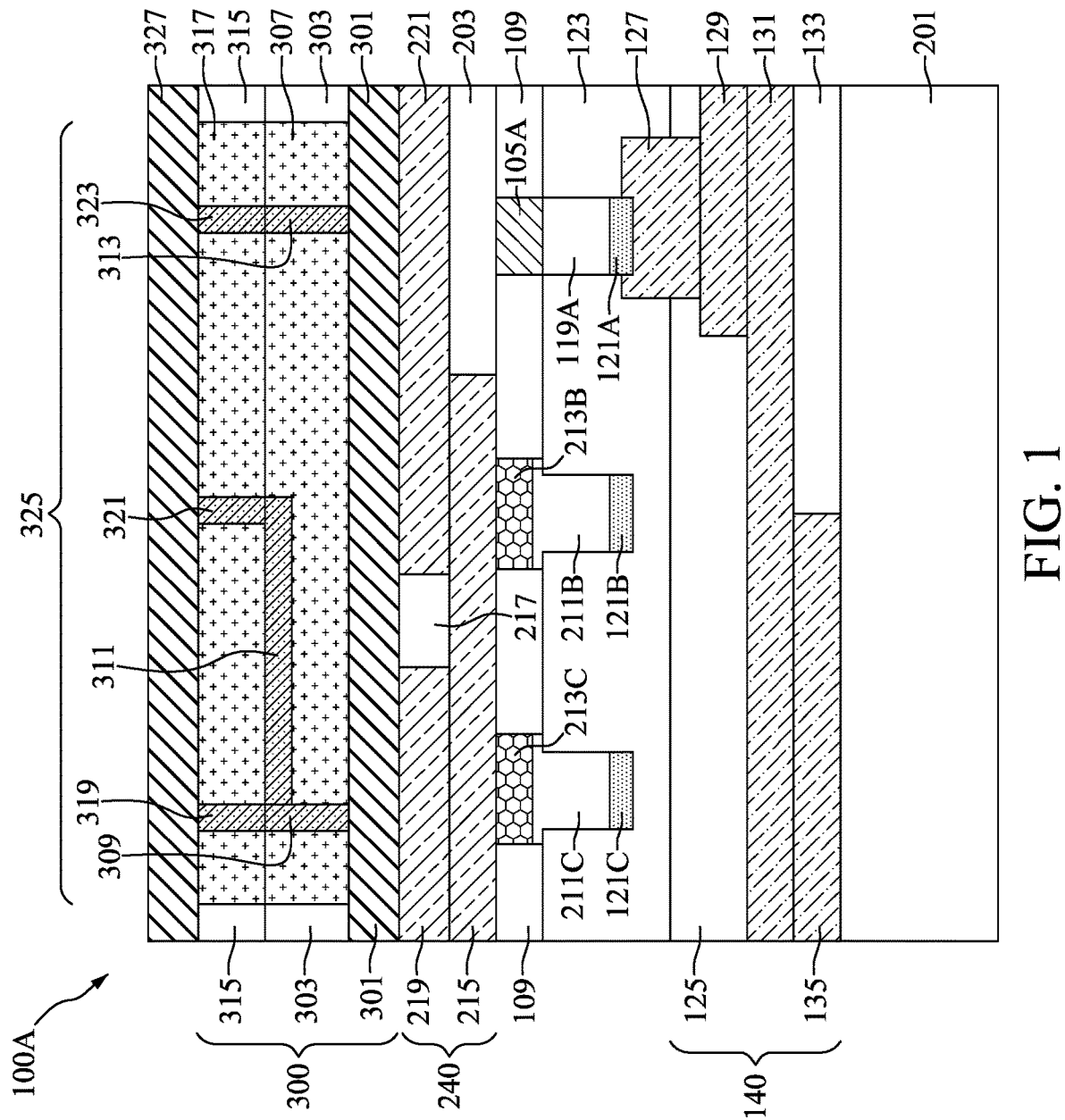
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100A, in accordance with some embodiments. In some embodiments, the semiconductor device 100A includes a carrier substrate 201, and a redistribution structure 140 disposed over the carrier substrate 201. As illustrated, the redistribution structure 140 includes two dielectric layers 133 and 125, and three conductive layers 135, 131 and 129. In other embodiments, the redistribution structure 140 can include any number of dielectric layers, conductive layers, and vias.

Moreover, the semiconductor device 100A includes a dielectric layer 123 disposed over the redistribution structure 140, and a plurality of source/drain structures 119A, 211B and 211C and a plurality of seed layers 121A, 121B and 121C disposed in the dielectric layer 123. In some embodiments, the source/drain structures 119A, 211B and 211C are disposed over the seed layers 121A, 121B and 121C, respectively. Although FIG. 1 only shows three source/drain structures, it is understood that this is for ease of illustration, and any number of source/drain contacts may be used, depend on the functional requirements of the semiconductor device 100A.

In some embodiments, the semiconductor device 100A further includes a frontside contact 127 disposed between the seed layer 121A and the conductive layer 129 of the redistribution structure 140. In some embodiments, the source/drain contact 119A is electrically connected to the carrier substrate 210 through the seed layer 121A, the frontside contact 127, and the conductive layers 129, 131 and 133 of the redistribution structure 140. In some embodiments, the source/drain structures 211B and 211C are electrically isolated from the redistribution structure 140.

In some embodiments, the semiconductor device 100A includes an isolation structure 109 disposed over the dielectric layer 123, a fin structure 105A and backside contacts 213B and 213C surrounded by the isolation structure 109. Moreover, the fin structure 105A is disposed over the source/drain structure 119A, and the backside contacts 213B and 213C are disposed over the source/drain structures 211B and 211C, respectively. In addition, the semiconductor device 100A includes a patterned mask 203 disposed over the fin structure 105A, and a redistribution structure 240 disposed over the isolation structure 109 and the patterned mask 203. As illustrated, the redistribution structure 240 includes three conductive layers 215, 219 and 221, and one dielectric layer 217. In other embodiments, the redistribution structure 240 can include any number of conductive layers, vias, and dielectric layers.

Still referring to FIG. 1, an interconnect part 300 is disposed over the redistribution structure 240, in accordance with some embodiments. In some embodiments, the interconnect part 300 includes a lower redistribution layer 301, an upper redistribution layer 327, and an interconnect frame 325 disposed between and electrically connected to the lower redistribution layer 301 and the upper redistribution layer 327. In addition, the lower redistribution layer 301 is electrically connected to the source/drain structures 211B and 211C through the redistribution structure 240 and the backside contacts 213B and 213C, in accordance with some embodiments.

Each of the lower redistribution layer 301 and the upper redistribution layer 327 may include one or more dielectric portions (not shown) and one or more conductive portions (not shown), the number of the dielectric portions and the number of the conductive portions depend on the routing requirements of the redistribution layer. In some embodiments, the interconnect part 300 also includes a dielectric structure and a passivation structure disposed between the lower redistribution layer 301 and the upper redistribution layer 327. In some embodiments, the interconnect frame 325 is disposed in the dielectric structure, and the dielectric structure is surrounded by the passivation structure. Specifically, the dielectric structure includes a lower portion 307 and an upper portion 317, and the passivation structure includes a lower portion 303 and an upper portion 315, in accordance with some embodiments.

As illustrated, the interconnect frame 325 includes two via portions 309 and 313 vertically extending through the lower portion 307 of the dielectric structure, three via portions 319, 321 and 323 vertically extending through the upper portion 317 of the dielectric structure, and one line portion 311 horizontally extending between the via portions 309 and 321. In other embodiments, the interconnect frame 325 can include any number of line portions and via portions. As shown in FIG. 1, the via portions 319 and 323 are disposed over and electrically connected to the via portions 309 and 313, respectively, in accordance with some embodiments.

Figure 2:
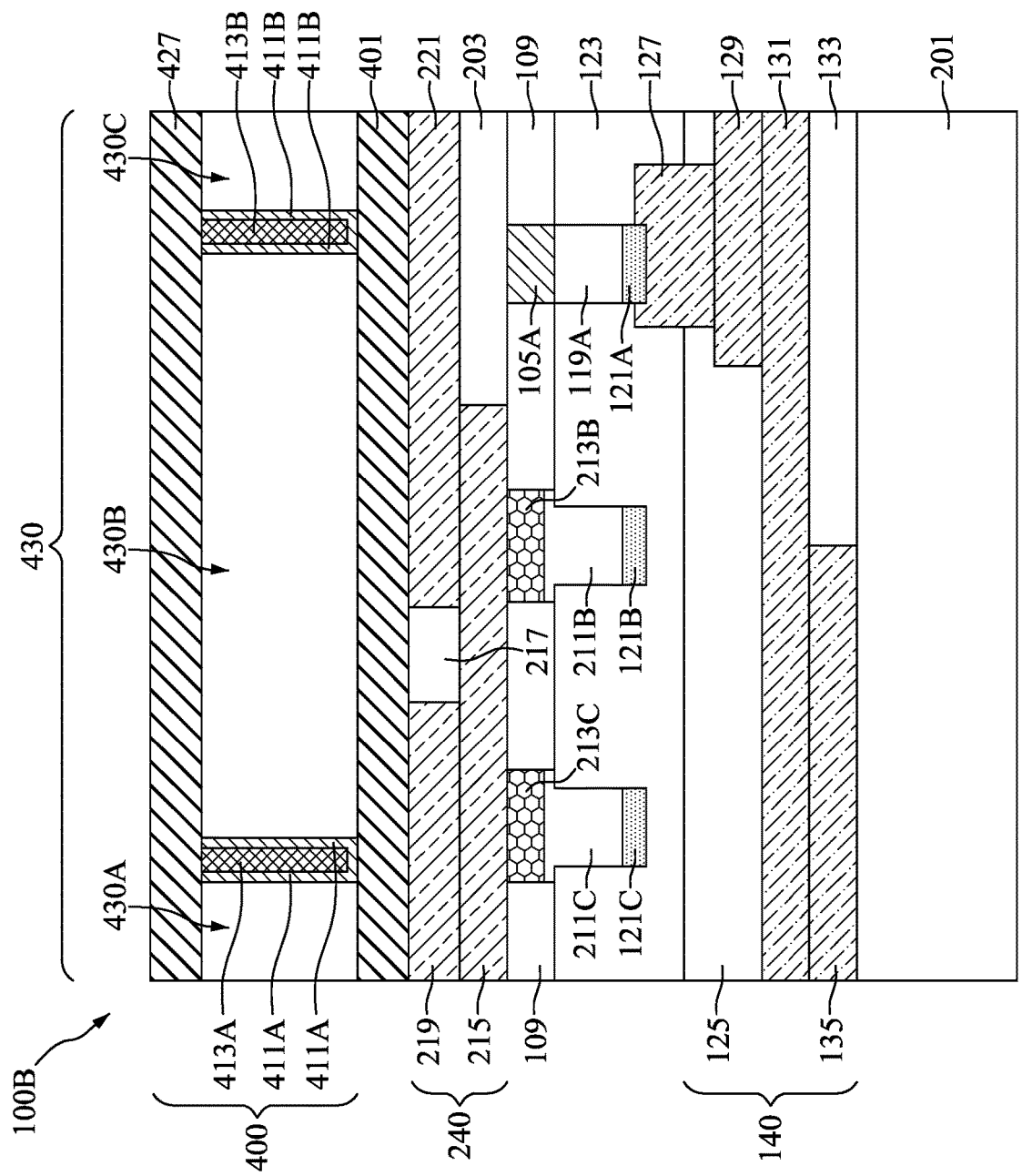
FIG. 2 is a cross-sectional view illustrating a semiconductor device, in accordance with some embodiments.

FIG. 2 is a cross-sectional view illustrating a semiconductor device 100B, in accordance with some embodiments. Semiconductor device 100B may be similar to the semiconductor device 100A, where same reference numbers refer to the same elements, and certain details or descriptions of the same elements are not repeated.

In some embodiments, the semiconductor device 100B includes an interconnect part 400 disposed over the redistribution structure 240. In some embodiments, the interconnect part 400 includes a lower redistribution layer 401, an upper redistribution layer 427, and interconnect conductors 413A and 413B extending in parallel between the lower redistribution layer 401 and the upper redistribution layer 427. In some embodiments, the upper redistribution layer 427 and the lower redistribution layer 401 are electrically connected by the interconnect conductors 413A and 413B. In addition, the lower redistribution layer 401 is electrically connected to the source/drain structures 211B and 211C through the redistribution structure 240 and the backside contacts 213B and 213C, in accordance with some embodiments.

Each of the lower redistribution layer 401 and the upper redistribution layer 427 may include one or more dielectric portions (not shown) and one or more conductive portions (not shown), the number of the dielectric portions and the number of the conductive portions depend on the routing requirements of the redistribution layer. In some embodiments, the interconnect part 400 also includes a passivation liner 411A surrounding the interconnect conductor 413A, and a passivation liner 411B surrounding the interconnect conductor 413B. Moreover, the passivation liners 411A and 411B are surrounded by an air gap structure 430.

In some embodiments, the air gap structure 430 includes air gaps 430A, 430B and 430C. As shown in FIG. 2, the interconnect conductor 413A is disposed between the air gaps 430A and 430B of the air gap structure 430, and the interconnect conductor 413B is disposed between the air gaps 430B and 430C of the air gap structure 430. Although three air gaps 430A, 430B and 430C are shown in the cross-sectional view of FIG. 2, the three air gaps may be connected to each other in other cross-sectional views.

In some embodiments, the sidewalls of the interconnect conductors 413A and 413B are entirely covered by the passivation liners 411A and 411B, respectively, such that the passivation liners 411A and 411B are in direct contact with the lower redistribution layer 401 and the upper redistribution layer 427. In other words, the first interconnect conductors 413A and 413B are separated from the air gap structure 430 by the passivation liners 411A and 411B, respectively. As illustrated, the interconnect part 400 of the semiconductor device 100B includes two interconnect conductors 413A and 413B. In other embodiments, the interconnect part 400 can include any number of interconnect conductors.

Figure 3:
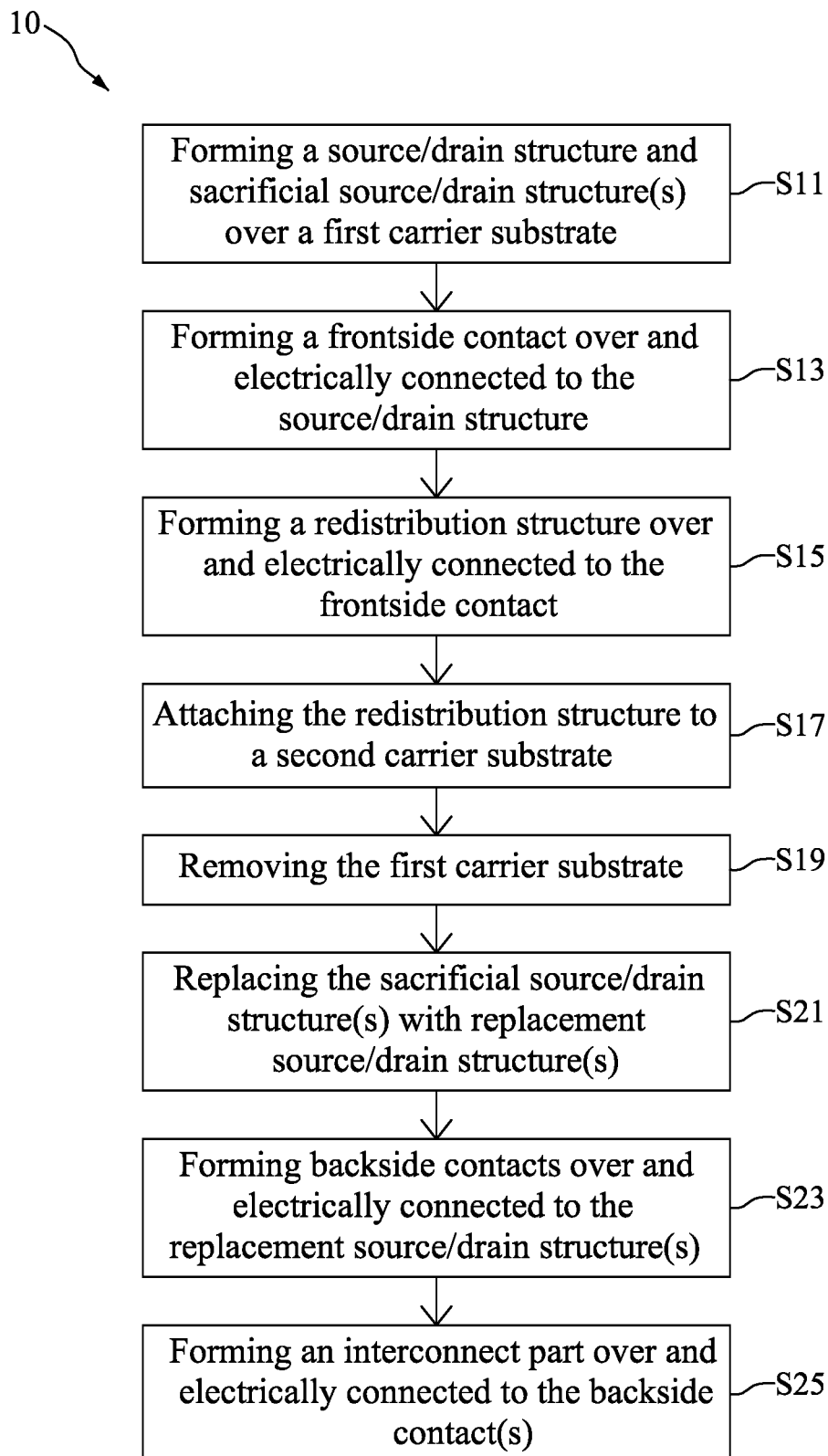
FIG. 3 is a flow diagram illustrating a method for preparing a semiconductor device, in accordance with some embodiments.
Figure 4:
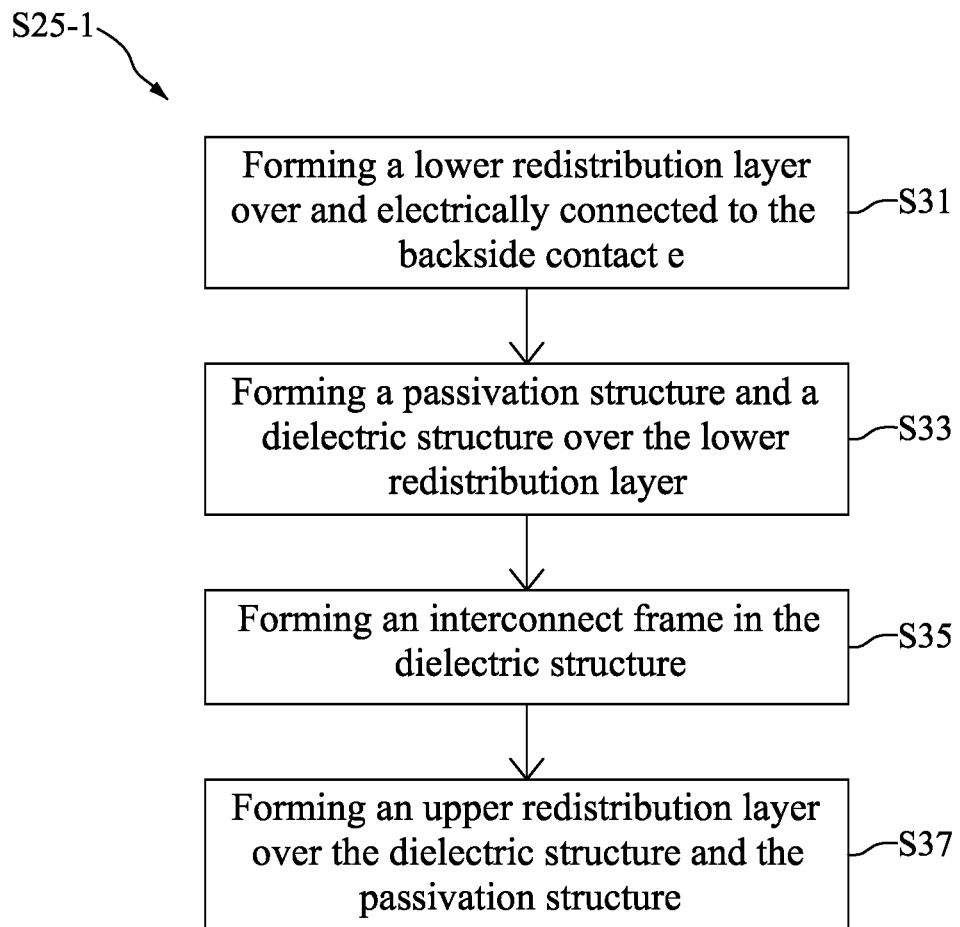
FIG. 4 is a flow diagram illustrating an intermediate stage of forming an interconnect part during the formation of the semiconductor device, in accordance with some embodiments.
Figure 5:
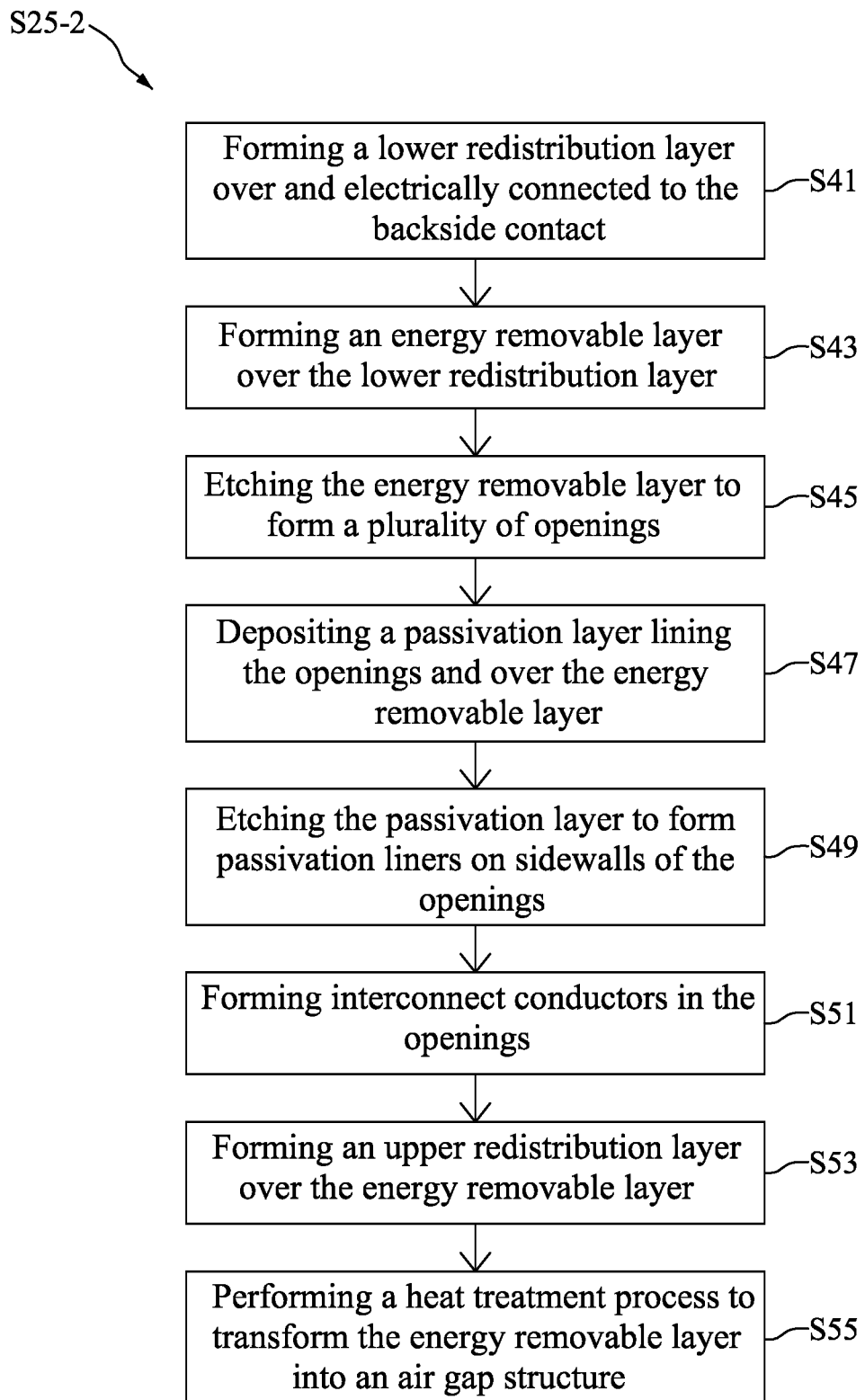
FIG. 5 is a flow diagram illustrating an intermediate stage of forming an interconnect part during the formation of the semiconductor device, in accordance with some embodiments.

FIG. 3 is a flow diagram illustrating a method 10 for forming a semiconductor device (e.g., the semiconductor devices 100A and 100B), and the method 10 includes steps S11, S13, S15, S17, S19, S21, S23, and S25, in accordance with some embodiments. FIG. 4 is a flow diagram illustrating multiple sub-steps of step S25-1, which corresponds to the step S25 of the method 10 in accordance with some embodiments. The step S25-1 includes sub-steps S31, S33, S35, and S37. FIG. 5 is a flow diagram illustrating multiple sub-steps of step S25-2, which corresponds to the step S25 of the method 10 in accordance with some embodiments. The step S25-2 includes sub-steps S41, S43, S45, S47, S49, S51, S53, and S55. The steps S11 to S25 of FIG. 3, the sub-steps S31 to S37 of FIG. 4, and the sub-steps S41 to S55 of FIG. 5 are first introduced briefly and then elaborated in connection with the following figures.

Figure 6:
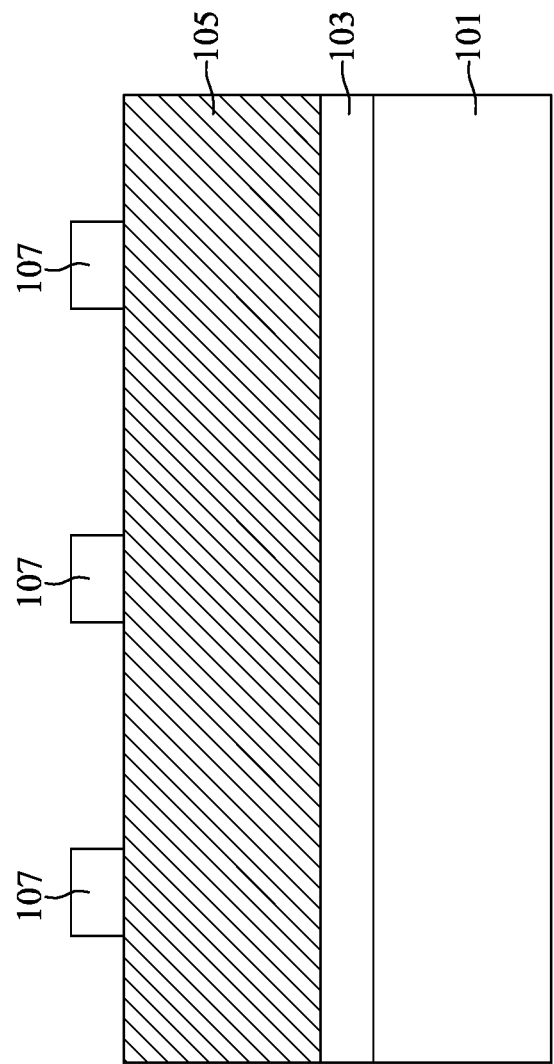
FIG. 6 is a cross-sectional view illustrating an intermediate stage of forming a semiconductor layer over a first carrier substrate during the formation of the semiconductor device, in accordance with some embodiments.

An etch stop layer 103 and a semiconductor layer 105 are sequentially formed over a first carrier substrate 101, as shown in FIG. 6 in accordance with some embodiments. In some embodiments, the first carrier substrate 101 is used as a temporary substrate. The temporary substrate provides mechanical and structural support during subsequent processing steps, such as those described in more detail later. In some embodiments, the first carrier substrate 101 is made of a semiconductor material, ceramic material, polymer material, metal material, another applicable material, or a combination thereof. In some embodiments, the first carrier substrate 101 is a glass substrate.

In some embodiments, the etch stop layer 103 is made of silicon oxide, silicon nitride, silicon oxynitride, and/or other suitable materials. Moreover, the etch stop layer 103 may be formed by a chemical vapor deposition (CVD) process, a physical vapor deposition (PVD) process, an atomic layer deposition (ALD) process, a spin-coating process, or another suitable process. In some embodiments, the semiconductor layer 105 includes polysilicon, amorphous silicon, and/or other semi-conducting materials, and may be formed by a deposition process, such as a CVD process, a PVD process, or an ALD process. Moreover, a patterned mask 107 is formed over the semiconductor layer 105, in accordance with some embodiments. The patterned mask 107 may be formed by deposition process and a subsequent patterning process.

Figure 7:
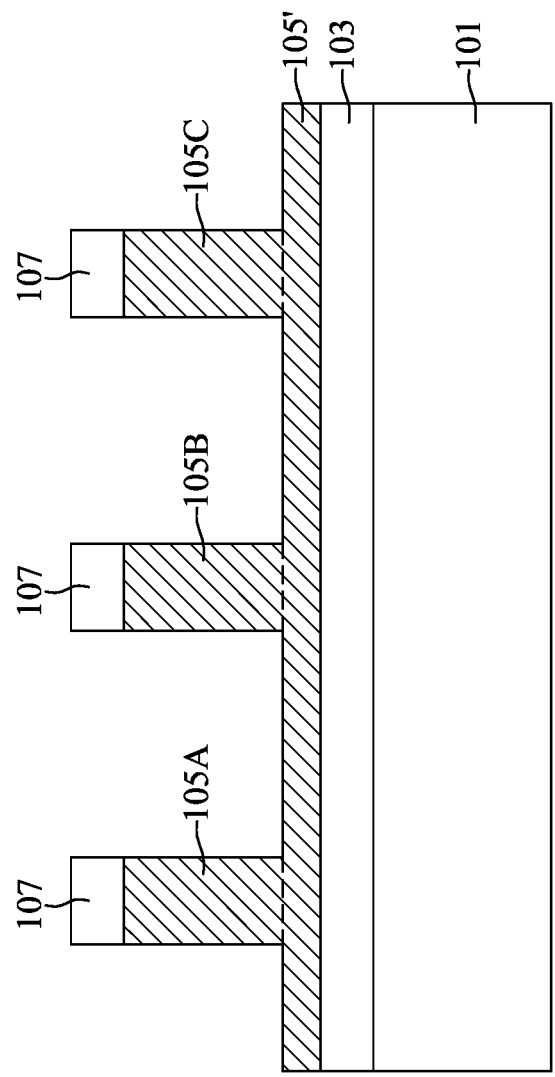
FIG. 7 is a cross-sectional view illustrating an intermediate stage of etching the semiconductor layer to form fin structures during the formation of the semiconductor device, in accordance with some embodiments.

Next, an etching process is performed on the semiconductor layer 105 using the patterned mask 107 as a mask, as shown in FIG. 7 in accordance with some embodiments. As a result, a base layer 105' and a plurality of fin structures 105A, 105B and 105C over the base layer 105' are obtained. The etching process may be a dry etching process or a wet etching process.

In some embodiments, the semiconductor layer 105 is etched by a dry etching process. The dry etching process includes using a fluorine-based etchant gas, such as $SF_6$, $C_xF_y$, $NF_3$, or a combination thereof. The etching process may be a time-controlled process, and continue until the fin structures 105A, 105B and 105C reach a predetermined height. In some other embodiments, each of the fin structures 105A, 105B and 105C has a width that gradually increases from the top portion to the lower portion.

Figure 8:
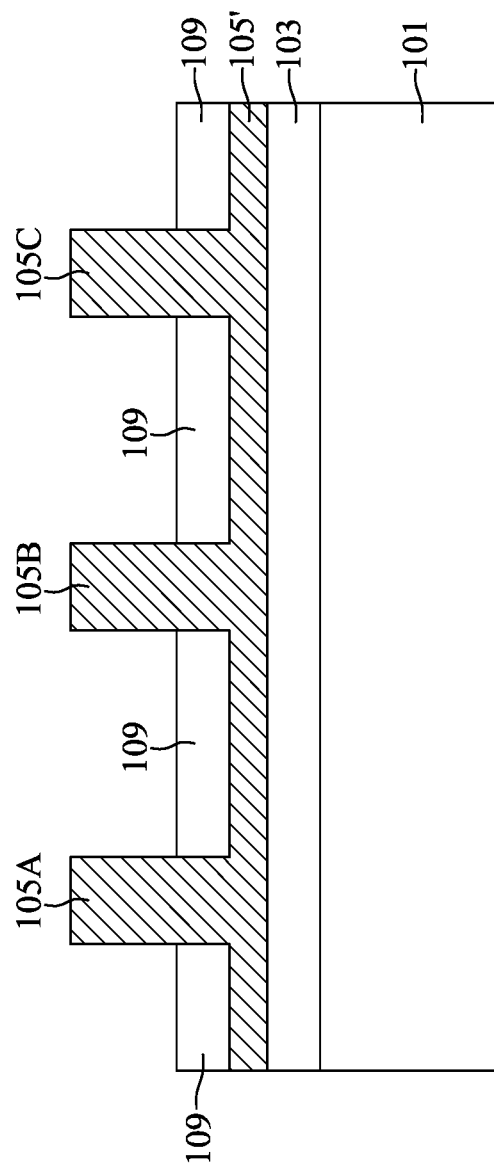
FIG. 8 is a cross-sectional view illustrating an intermediate stage of forming an isolation structure between the fin structures during the formation of the semiconductor device, in accordance with some embodiments.

After the fin structures 105A, 105B and 105C are formed, the patterned mask 107 can be removed, and an isolation structure 109 is formed between the fin structures 105A, 105B and 105C, as shown in FIG. 8 in accordance with some embodiments. In some embodiments, the isolation structure 109 is a shallow trench isolation (STI) structure surrounding the lower portion of each of the fin structures 105A, 105B and 105C. More specifically, the lower portions of the fin structures 105A, 105B and 105C are surrounded by the isolation structure 109, while upper portions of the fin structures 105A, 105B and 105C protrude from the isolation structure 109.

The isolation structure 109 is configured to prevent electrical interference or crosstalk. In some embodiments, the isolation structure 109 is made of silicon oxide, silicon nitride, silicon oxynitride, or another low-k dielectric material. In addition, the isolation structure 109 may be formed by a deposition process and a subsequent etching process.

Figure 9:
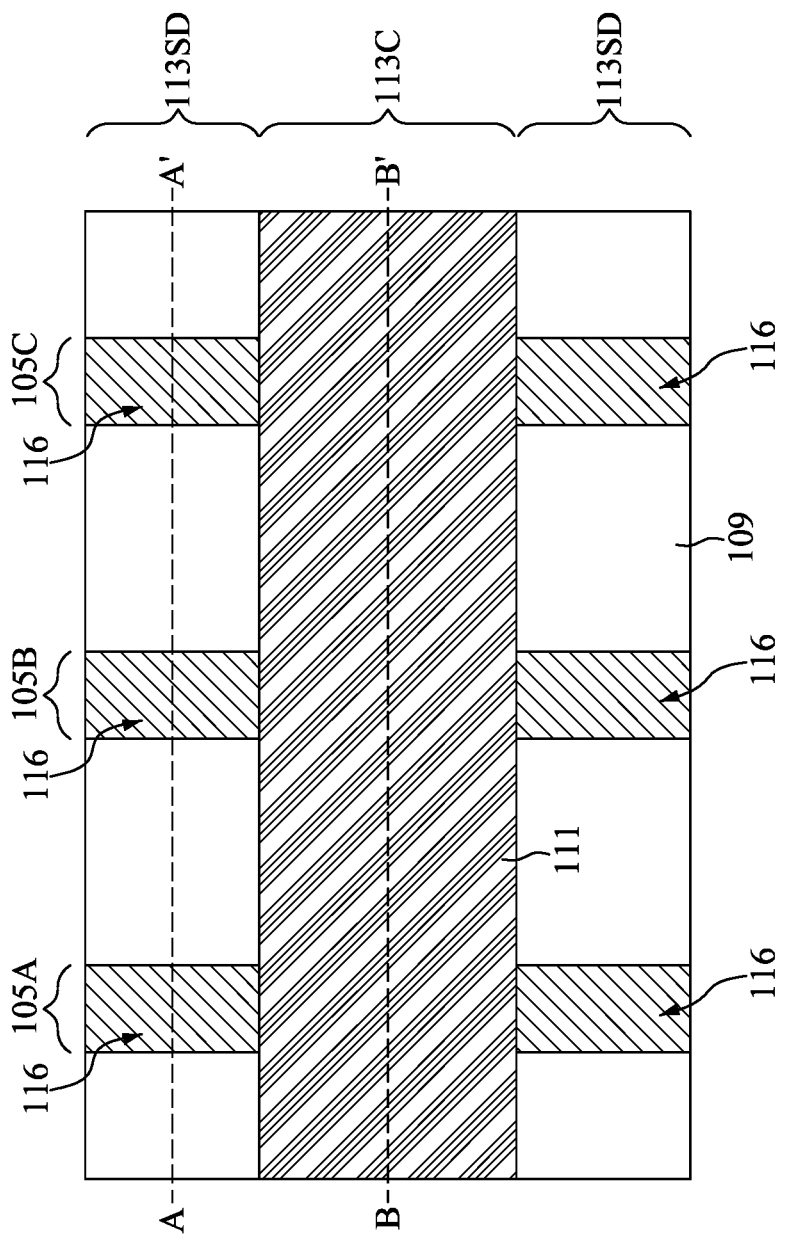
FIG. 9 is a top view illustrating an intermediate stage of forming a gate structure across the fin structures and forming recesses at two sides of the gate structure during the formation of the semiconductor device, in accordance with some embodiments.
Figure 10:
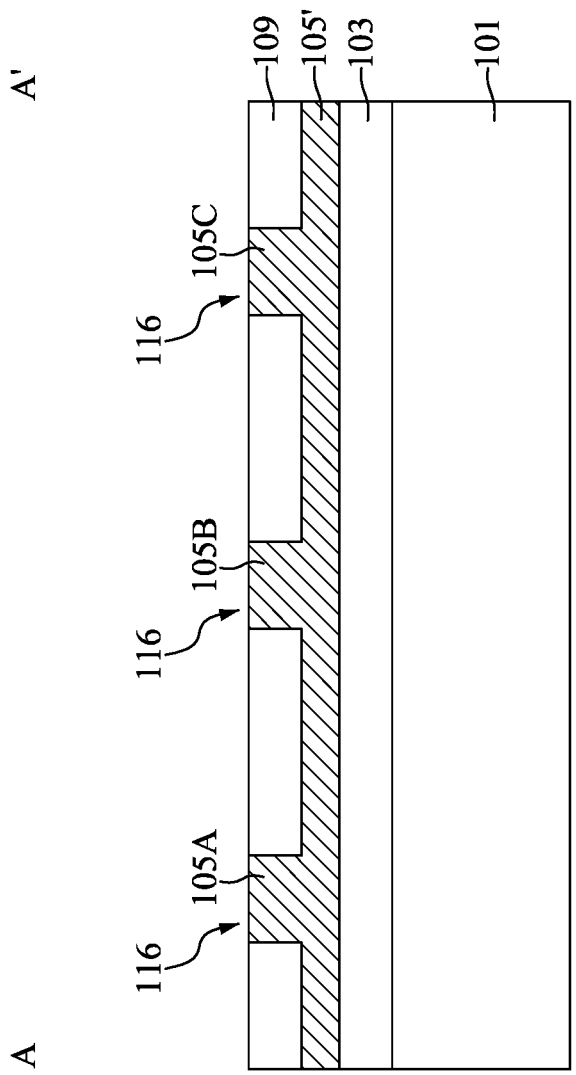
FIG. 10 is a cross-sectional view illustrating an intermediate stage in the formation of the semiconductor device along the sectional line A-A' of FIG. 9, in accordance with some embodiments.
Figure 11:
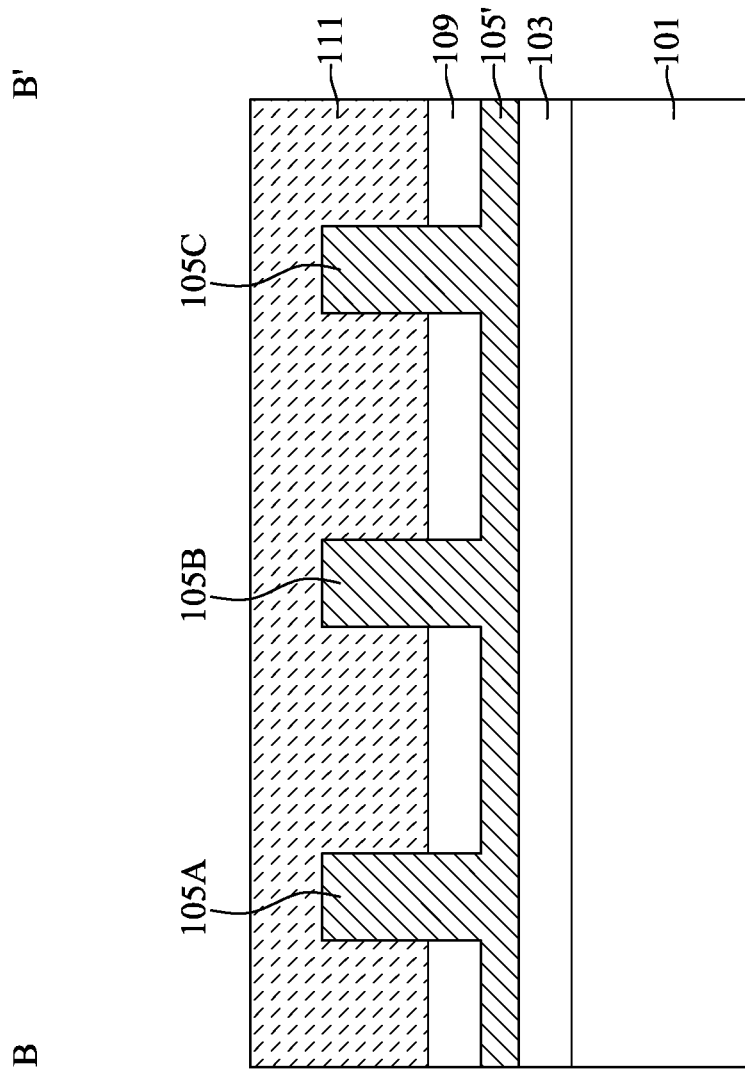
FIG. 11 is a cross-sectional view illustrating an intermediate stage in the formation of the semiconductor device along the sectional line B-B' of FIG. 9, in accordance with some embodiments.

Next, a gate structure 111 is formed across the fin structures 105A, 105B, 105C and extends over the isolation structure 109, and portions of the fin structures 105A, 105B and 105C adjacent to the gate structure 111 are recessed to form recesses 116 at two sides of the fin structures 105A, 105B, 105C, as shown in FIGS. 9 to 11 in accordance with some embodiments. In some embodiments, the gate structure 111 is formed over a channel region 113C of the fin structures 105A, 105B, 105C, and the recesses 116 are formed over a source/drain regions 113SD of the fin structures 105A, 105B, 105C.

In some embodiments, the gate structure 111 includes a gate dielectric layer (not shown) and a gate electrode layer (not shown) disposed over the gate dielectric layer. In addition, the gate structure 111 may be formed in a gate first process, a gate last process, or a combination thereof. The gate first process, the gate last process, or a combination thereof include deposition processes, patterning processes, etching processes, or combinations thereof. The recesses 116 may be formed after the gate structure 111 is formed, and the recesses 116 may be formed by an etching process, including a wet etching process, a dry etching process, or a combination thereof.

Figure 12:
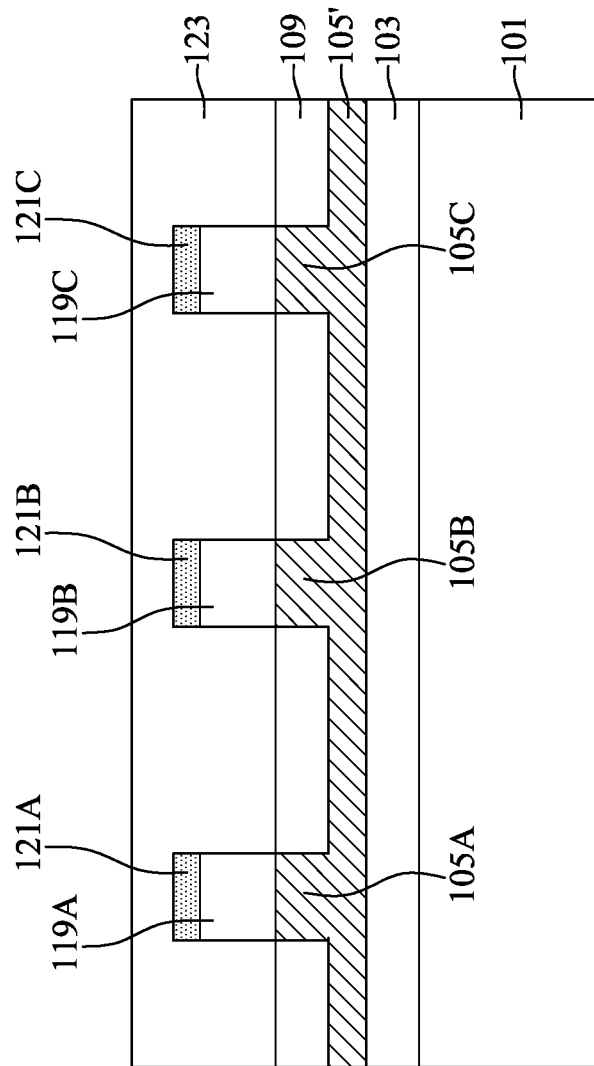
FIG. 12 is a cross-sectional view illustrating an intermediate stage of forming a source/drain structure and sacrificial source/drain structure(s) over the etched fin structures during the formation of the semiconductor device, in accordance with some embodiments.

Then, source/drain structures 119A, 119B and 119C are formed in the recesses 116, which are over the portions of the fin structures 105A, 105B and 105C in the source/drain regions 113SD, as shown in FIG. 12 in accordance with some embodiments. It should be noted that FIGS. 1, 2, and 12-29 are cross-sectional views along a line cut through the source/drain regions 113SD of the fin structures 105A, 105B and 105C. In some embodiments, a strained material is grown in the recesses 116 using an epitaxial process to form the source/drain structures 119A, 119B and 119C. In some embodiments, the strained material of the source/drain structures 119A, 119B and 119C includes Ge, SiGe, InAs, InGaAs, InSb, GaAs, GaSb, InAlP, InP, or the like.

Still referring to FIG. 12, seed layers 121A, 121B and 121C are formed over the source/drain structures 119A, 119B and 119C, and a dielectric layer 123 is formed covering the seed layers 121A, 121B and 121C and the isolation structure 109, in accordance with some embodiments. At least one of the source/drain structures 119A, 119B and 119C may be a sacrificial source/drain structure, which will be replaced by a replacement source/drain structure in the subsequent processes. In some embodiments, the source/drain structures 119B and 119C are sacrificial source/drain structures, and the seed layers 121A, 121B and 121C are formed to assist with the subsequent structure inversion and backside removal of the sacrificial source/drain structures 119B and 119C and regrowth of the replacement source/drain structures. The respective step is illustrated as the step S11 in the method 10 shown in FIG. 3.

The seed layers 121A, 121B and 121C may have an etch rate that is relatively lower than the sacrificial source/drain structures 119B and 119C using a given etchant, such that the sacrificial source/drain structures 119B and 119C can be effectively removed while leaving at least a portion of the seed layers 121B and 121C from which the replacement source/drain structures can be grown. In other words, the seed layers 121B and 121C can act as an etch stop for the sacrificial source/drain structures 119B and 119C etch process. For example, the seed layers 121A, 121B and 121C include Si or SiGe with 10% less Ge relative to the material of the sacrificial source/drain structures 119B and 119C.

In addition, the dielectric layer 123 may be an interlayer dielectric (ILD) structure including a single or multiple layers. In some embodiments, the dielectric layer 123 includes silicon oxide, silicon nitride, silicon oxynitride, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In addition, the dielectric layer 123 may be formed by a CVD process, a PVD process, an ALD process, a spin-coating process, or another suitable process.

Figure 13:
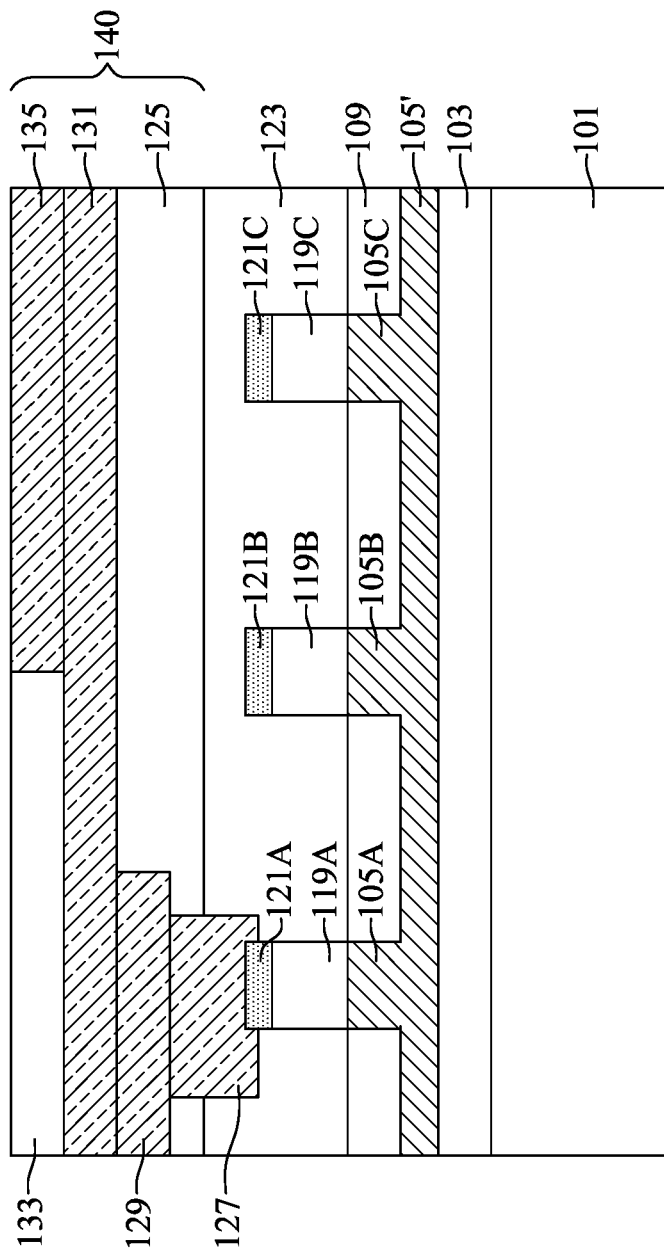
FIG. 13 is a cross-sectional view illustrating an intermediate stage of forming a frontside contact and a redistribution structure over the source/drain structure and the sacrificial source/drain structure(s) during the formation of the semiconductor device, in accordance with some embodiments.

After the dielectric layer 123 is formed, a frontside contact 127 is formed over the source/drain structure 119A, and a redistribution structure 140 is formed over the frontside contact 127, as shown in FIG. 13 in accordance with some embodiments. The respective steps are illustrated as the steps S13 and S15 in the method 10 shown in FIG. 3. In some embodiments, the redistribution structure 140 includes conductive layers 129, 131 and 135, and dielectric layers 125 and 133.

In some embodiments, the lower portion of the frontside contact 127 is embedded in the dielectric layer 123, while the upper portion of the frontside contact 127 is surrounded by the dielectric layer 125 of the redistribution structure 140. In some embodiments, the frontside contact 127 and the conductive layers 129, 131 and 135 are made of a conductive material, such as copper (Cu), tungsten (W), aluminum (Al), titanium (Ti), tantalum (Ta), gold (Au), silver (Ag), or a combination thereof, and the dielectric layers 125 and 133 are made of silicon oxide, silicon nitride, silicon oxynitride, or another low-k dielectric material. The formation of the frontside contact 127 and the formation of the redistribution structure 140 includes multiple deposition processes and etching processes. Although the frontside contact 127 and the conductive layers 129, 131 and 135 are shown as having distinguishable interfaces separating them from each other, when the frontside contact 127 and the conductive layers 129, 131 and 135 are formed of the same or similar material, the frontside contact 127 and the conductive layers 129, 131 and 135 may continuously connected with each other with no distinguishable interfaces therebetween.

Figure 14:
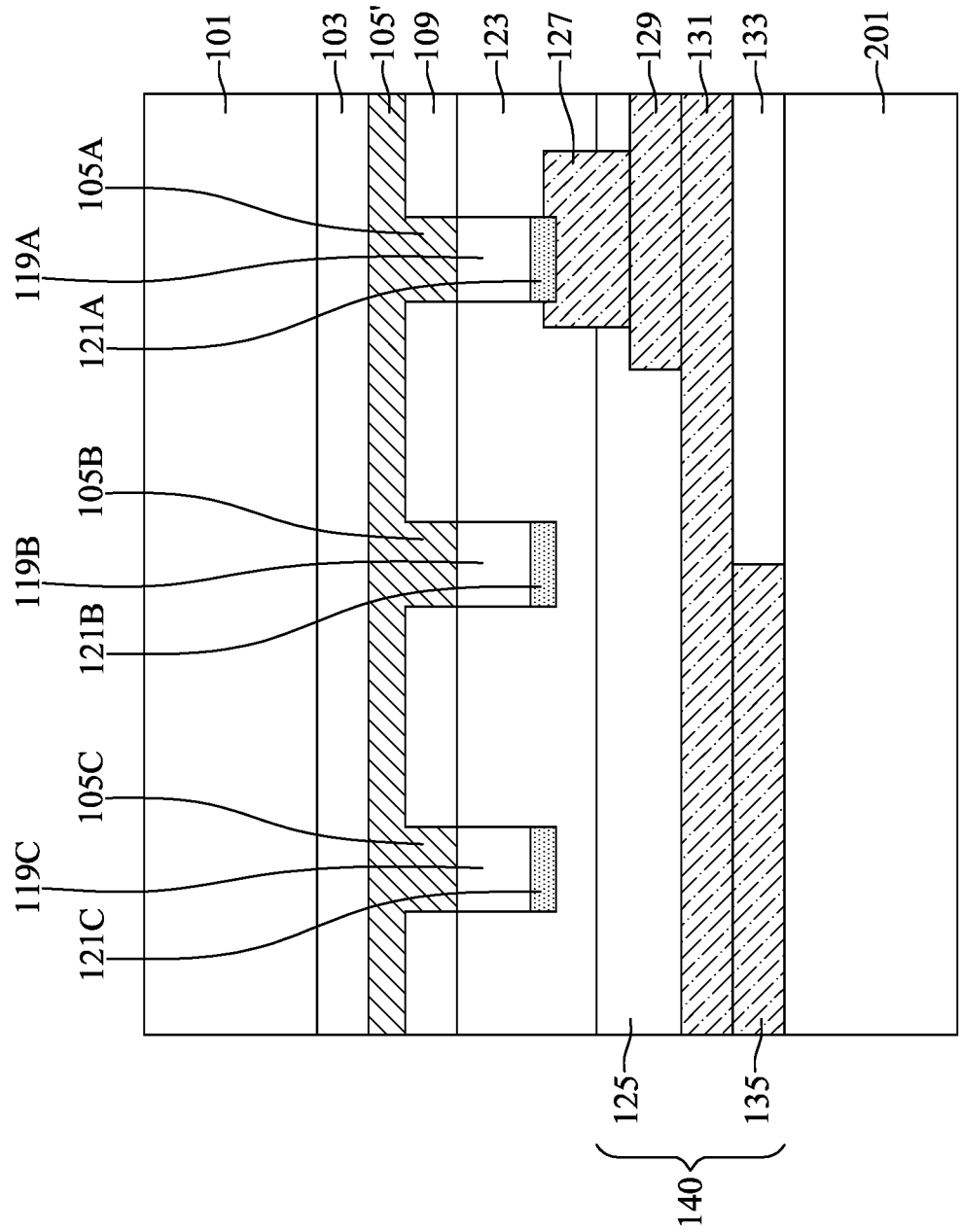
FIG. 14 is a cross-sectional view illustrating an intermediate stage of attaching the redistribution structure to a second carrier substrate during the formation of the semiconductor device, in accordance with some embodiments.

After the redistribution structure 140 is formed, the structure of FIG. 13 is turned upside down and placed over a second carrier substrate 201, as shown in FIG. 14 in accordance with some embodiments. In some embodiments, the redistribution structure 140 is attached to the second carrier substrate 201 by an adhesive layer (not shown). The respective step is illustrated as the step S17 in the method 10 shown in FIG. 3.

The second carrier substrate 201 is similar to the first carrier substrate 101, both of them provide mechanical and structural support during subsequent processing steps. In some embodiments, the second carrier substrate 201 is a portion of an integrated circuit (IC) chip that includes various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof. In these cases, the source/drain structure 119A is electrically connected to the devices in the second carrier substrate 201 through the frontside contact 127 and the redistribution structure 140.

Figure 15:
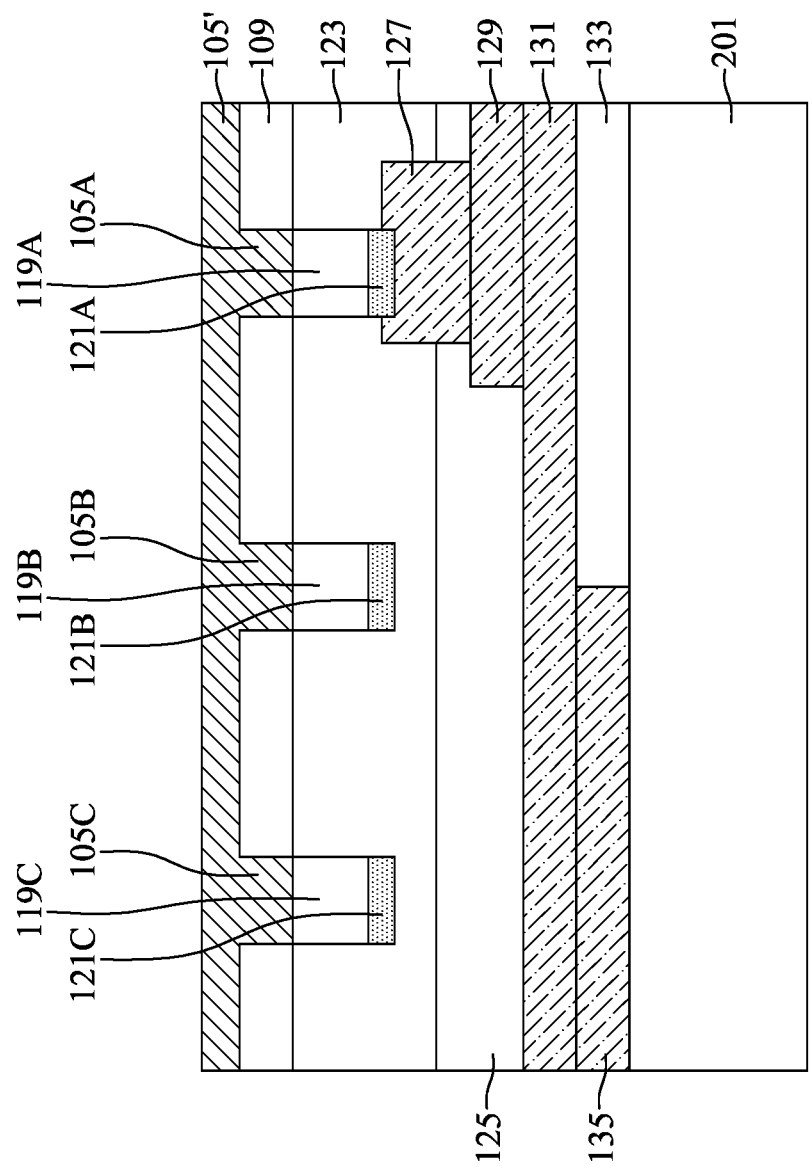
FIG. 15 is a cross-sectional view illustrating an intermediate stage of removing the first carrier substrate during the formation of the semiconductor device, in accordance with some embodiments.

Subsequently, the first carrier substrate 101 and the etch stop layer 103 are removed, as shown in FIG. 15 in accordance with some embodiments. The respective step is illustrated as the step S19 in the method 10 shown in FIG. 3. In some embodiments, the first carrier substrate 101 and the etch stop layer 103 are removed by a planarization process, and the planarization process. The planarization process may include a chemical mechanical polishing (CMP) process, a grinding process, an etching process, or a combination thereof.

Figure 16:
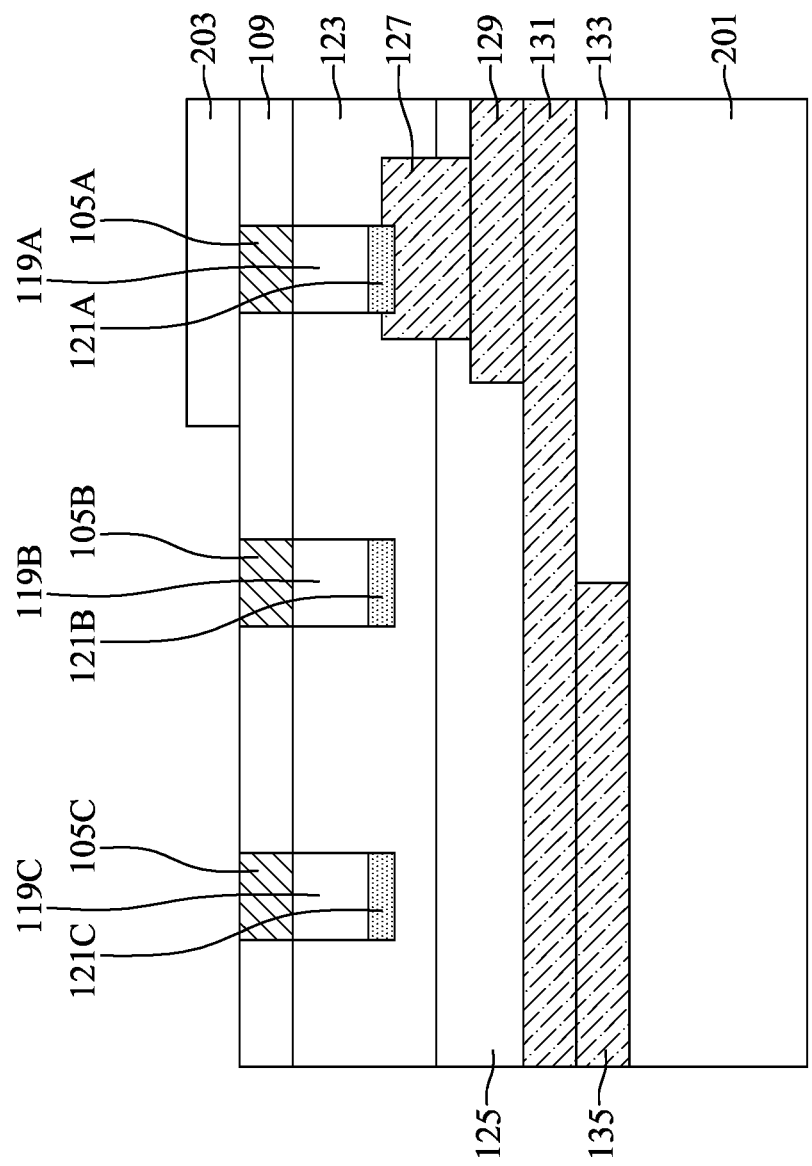
FIG. 16 is a cross-sectional view illustrating an intermediate stage of forming a patterned mask over the source/drain structure during the formation of the semiconductor device, in accordance with some embodiments.

Next, the base layer 105' is removed while the portions of the fin structures 105A, 105B and 105C in the source/drain region 113SD (see FIG. 9) remain, as shown in FIG. 16 in accordance with some embodiments. In some embodiments, the base layer 105' is removed by a planarization process, such as an etching process, a polishing process, or a combination thereof. In some embodiments, the planarization process is performed until the isolation structure 109 is exposed.

Since the source/drain structure 119A is not designed to be replaced in the subsequent processes, a patterned mask 203 is formed covering the portion of the fin structure 105A over the source/drain structure 119A to protect the source/drain structure 119A from subsequent processing steps. Some materials used to form the patterned mask 203 are similar to, or the same as those used to form the patterned mask 107, and details thereof are not repeated herein.

Figure 17:
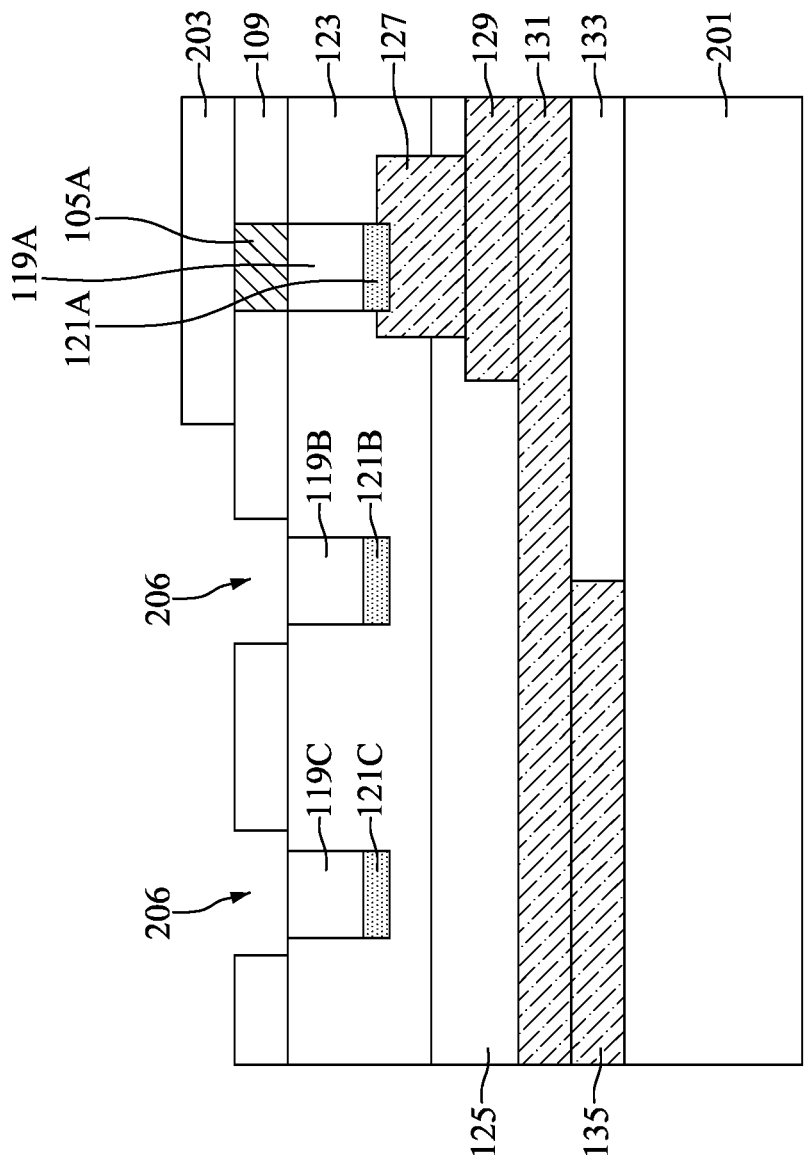
FIG. 17 is a cross-sectional view illustrating an intermediate stage of removing portions of the fin structures exposed by the patterned mask during the formation of the semiconductor device, in accordance with some embodiments.

Then, the portions of the fin structures 105B and 105C are removed by an etching process, as shown in FIG. 17 in accordance with some embodiments. As a result, openings 206 in the isolation structure 109 are obtained. In some embodiments, the etching process for forming the openings 206 includes a wet etching process, a dry etching process, or a combination thereof. In some embodiments, portions of the isolation structure 109 adjacent to the fin structures 105B and 105C are removed with the fin structures 105B and 105C, such that portions of the dielectric layer 123 and the source/drain structure 119B and 119C are exposed by the openings 206.

Figure 18:
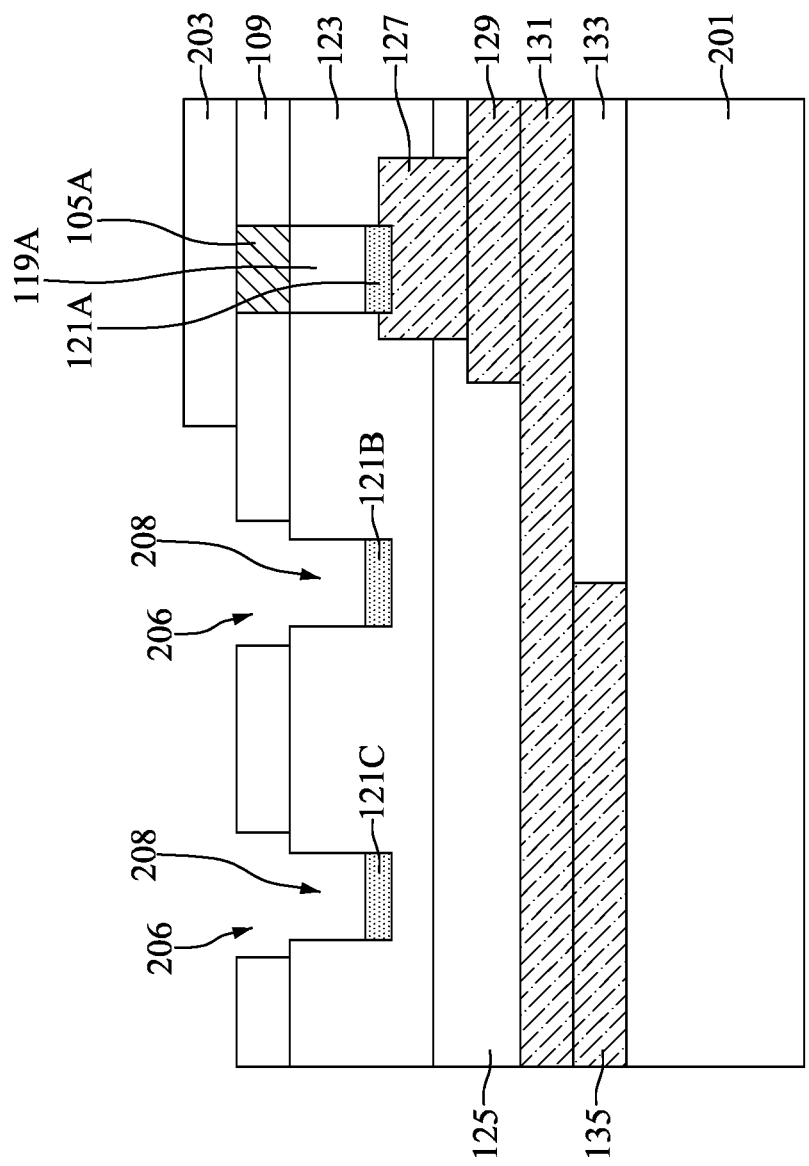
FIG. 18 is a cross-sectional view illustrating an intermediate stage of removing the sacrificial source/drain structure(s) during the formation of the semiconductor device, in accordance with some embodiments.

Subsequently, the source/drain structure 119B and 119C are removed by an etching process, as shown in FIG. 18 in accordance with some embodiments. As a result, openings 208 in the dielectric layer 123 are obtained. In some embodiments, the etching process for forming the openings 208 includes a wet etching process, a dry etching process, or a combination thereof. In some embodiments, at least a portion of each of the seed layers 121B and 121C is exposed by the openings 208. In some embodiments, the sidewalls of the portions of the fin structures 105A, 105B and 105C in the channel regions 113C (see FIG. 9) are exposed by the openings 208.

Figure 19:
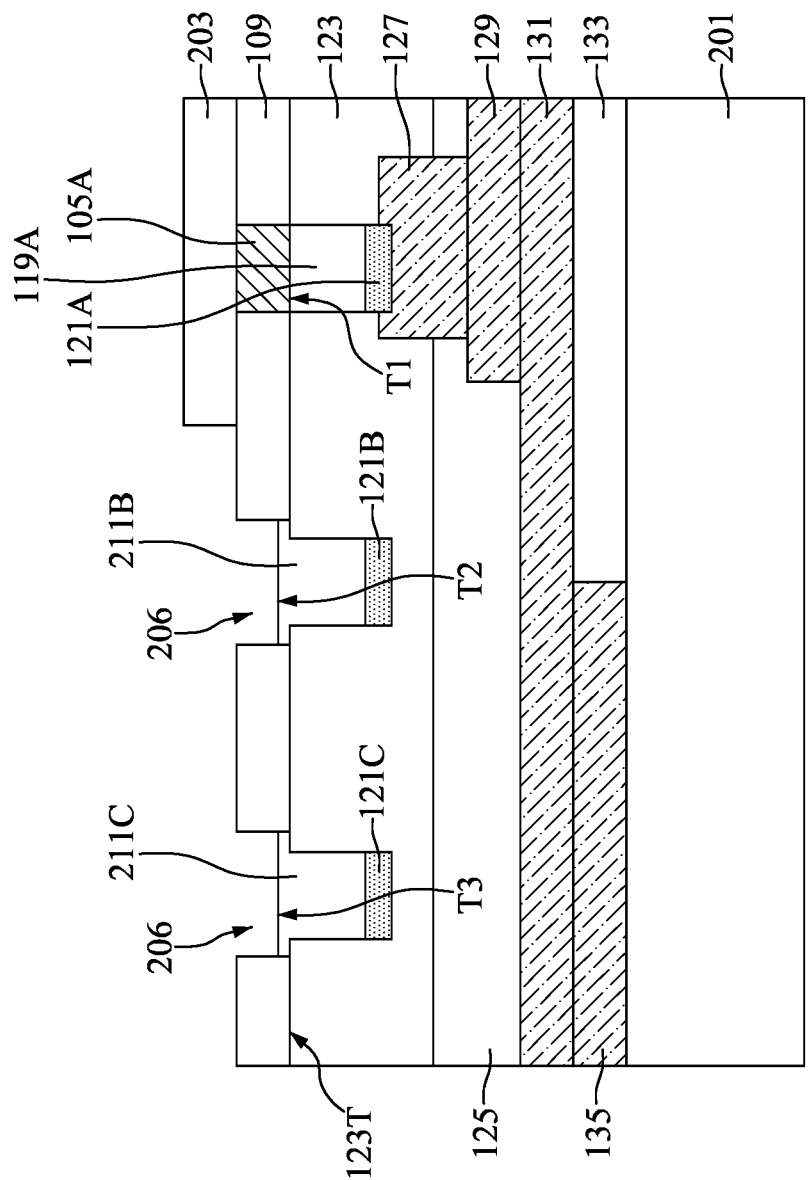
FIG. 19 is a cross-sectional view illustrating an intermediate stage of forming replacement source/drain structure(s) during the formation of the semiconductor device, in accordance with some embodiments.

After the openings 208 are formed, source/drain structures 211B and 211C (also referred to as replacement source/drain structures) are grown from the seed layers 121B and 121C, respectively, as shown in FIG. 19 in accordance with some embodiments. The respective step is illustrated as the step S21 in the method 10 shown in FIG. 3. In some embodiments, the source/drain structures 211B and 211C and the seed layers 121B and 121C include similar high-quality material, leading to improved performance of transistor-based devices including the source/drain structures 211B and 211C.

In some embodiments, portions of the source/drain structures 211B and 211C extend into the openings 206 to cover portions of the dielectric layer 123. In some embodiments, both the top surface T2 of the source/drain structure 211B and the top surface T3 of the source/drain structure 211C are higher than the top surface 123T of the dielectric layer 123. In some embodiments, both the top surface T2 of the source/drain structure 211B and the top surface T3 of the source/drain structure 211C are higher than the top surface T1 of the source/drain structure 119A.

Figure 20:
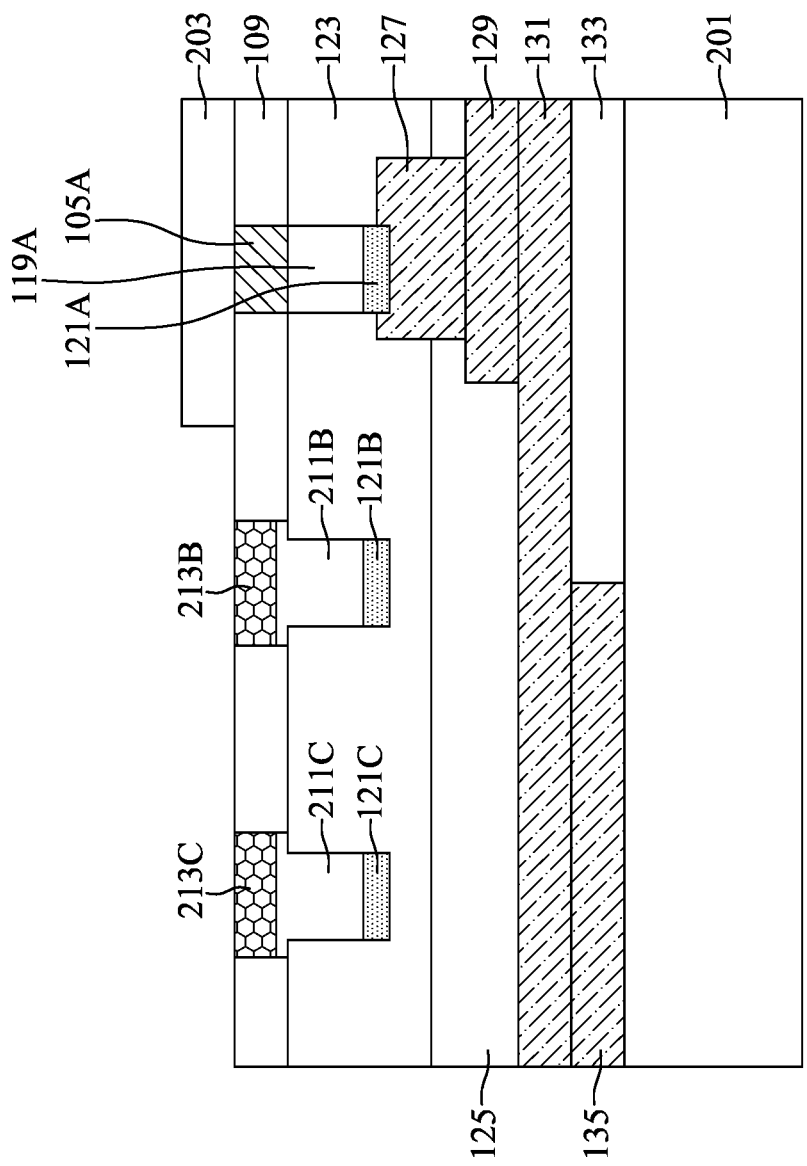
FIG. 20 is a cross-sectional view illustrating an intermediate stage of forming backside contact(s) during the formation of the semiconductor device, in accordance with some embodiments.

Next, backside contacts 213B and 213C are formed over the source/drain structures 211B and 211C, as shown in FIG. 20 in accordance with some embodiments. The respective step is illustrated as the step S23 in the method 10 shown in FIG. 3. Some materials and processes used to form the backside contacts 213B and 213C are similar to, or the same as those used to form the frontside contact 127 and details thereof are not repeated herein.

Figure 21:
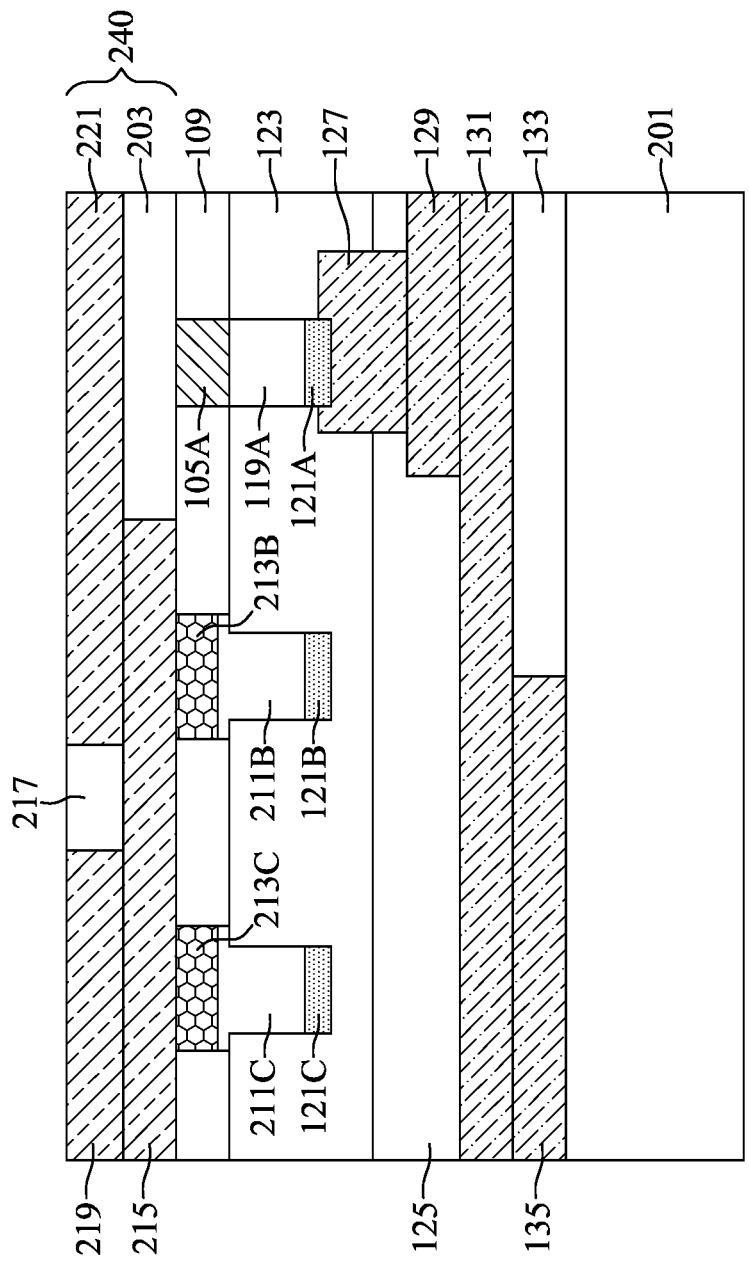
FIG. 21 is a cross-sectional view illustrating an intermediate stage of forming a redistribution structure over the backside contact(s) during the formation of the semiconductor device, in accordance with some embodiments.

Then, a redistribution structure 240 is formed over the backside contacts 213B and 213C, as shown in FIG. 21 in accordance with some embodiments. In some embodiments, the redistribution structure 240 includes conductive layers 215, 219 and 221, and a dielectric layer 217. Some materials and processes used to form the redistribution structure 240 are similar to, or the same as those used to form the redistribution structure 140 and details thereof are not repeated herein.

Figure 22:
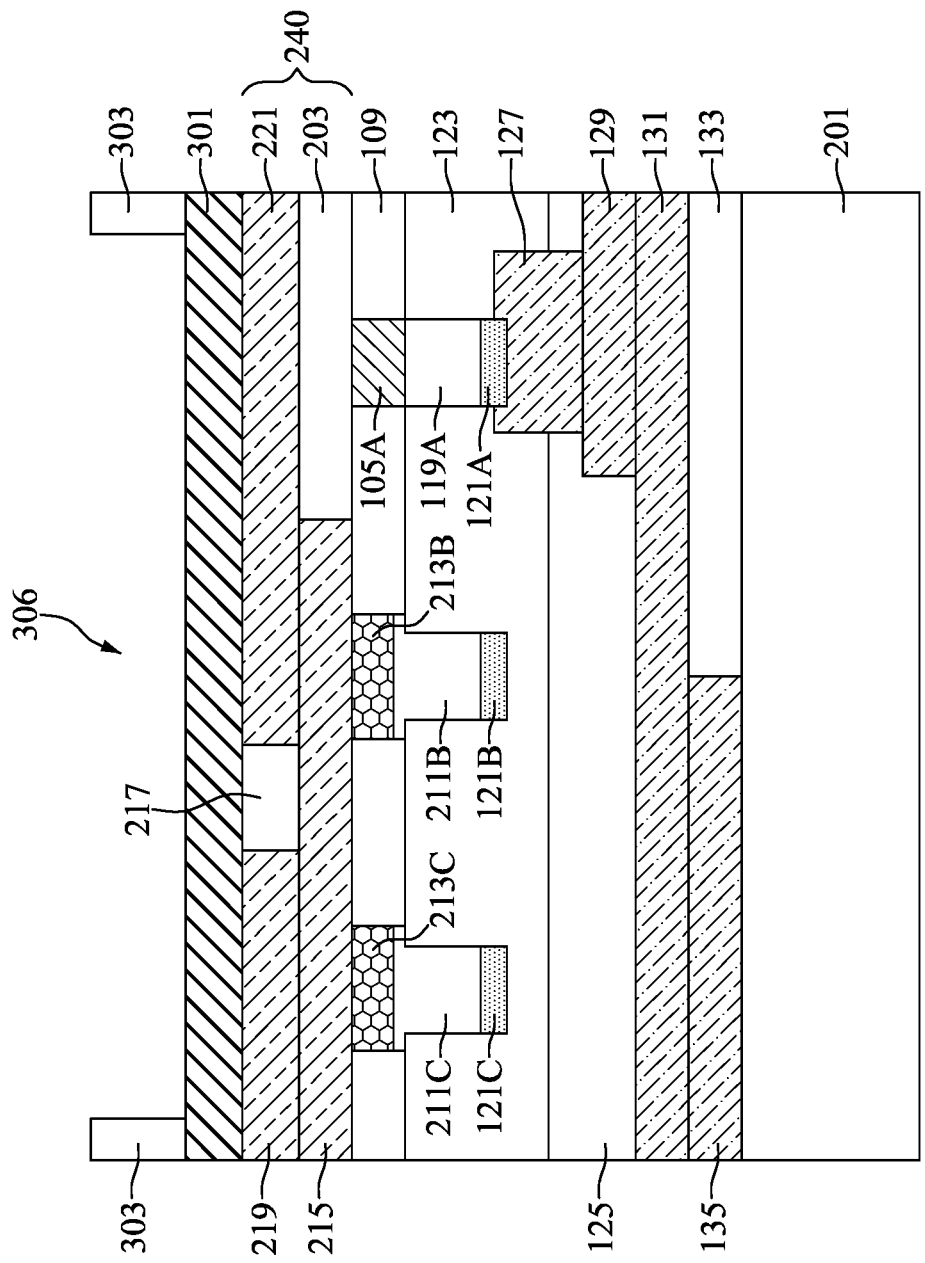
FIG. 22 is a cross-sectional view illustrating an intermediate stage of forming a lower redistribution layer and a lower portion of a passivation structure over the redistribution structure during the formation of the semiconductor device, in accordance with some embodiments.

Subsequently, a lower redistribution layer 301 is formed over the redistribution structure 240, as shown in FIG. 22 in accordance with some embodiments. The respective step is illustrated as the sub-step S31 in the step S25-1 shown in FIG. 4, which is the initial step of the step S25 in FIG. 3, in accordance with some embodiments. The lower redistribution layer 301 may include one or more dielectric portions (not shown) and one or more conductive portions (not shown), and the lower redistribution layer 301 may be formed by multiple deposition processes and multiple etching processes. In some embodiments, the lower redistribution layer 301 is electrically connected to the source/drain structures 211B and 211C through the redistribution structure 240 and the backside contacts 213B and 213C.

Still referring to FIG. 22, a lower portion 303 of a passivation structure is formed over the lower redistribution layer 301, in accordance with some embodiments. In some embodiments, an opening 306 exposing the lower redistribution layer 301 is surrounded by the lower portion 303 of the passivation structure. In some embodiments, the lower portion 303 of the passivation structure is made of silicon oxide, silicon nitride, silicon oxynitride, and/or other suitable materials, and the lower portion 303 of the passivation structure is formed by a deposition process and a subsequent etching process. The deposition process may include a CVD process, a PVD process, or an ALD process, and the etching process may include a wet etching process, a dry etching process, or a combination thereof.

Figure 23:
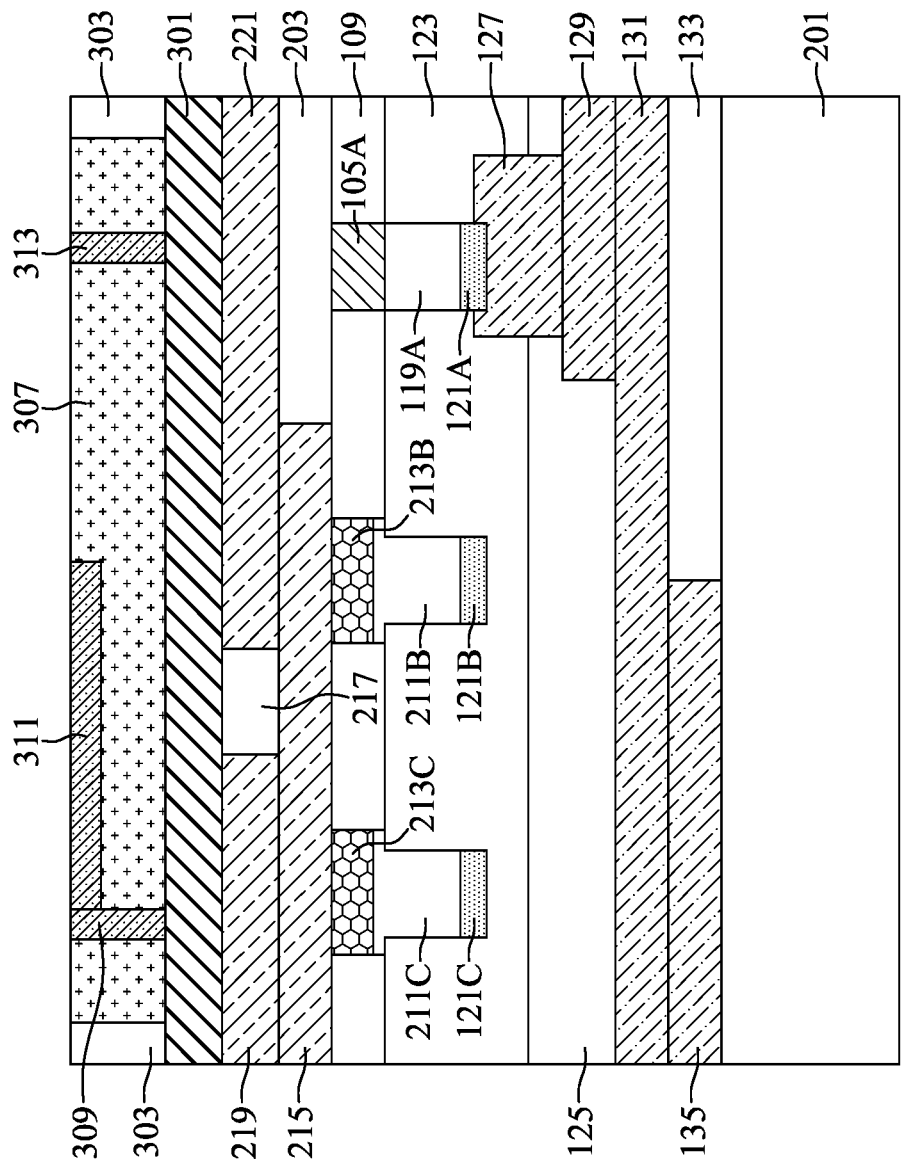
FIG. 23 is a cross-sectional view illustrating an intermediate stage of forming a lower portion of a dielectric structure and a lower portion of an interconnect frame over the lower redistribution layer during the formation of the semiconductor device, in accordance with some embodiments.

Next, a lower portion 207 of a dielectric structure is formed in the opening 306, and via portions 309, 313 and a line portion 311 are formed in the lower portion 207 of the dielectric structure, as shown in FIG. 23 in accordance with some embodiments. In some embodiments, the lower portion 207 of a dielectric structure is made of a low-k dielectric material, and is formed by a deposition process, such as CVD, PVD or ALD. In some embodiments, the via portions 309, 313 and the line portion 311 are made of a conductive material, such as copper (Cu), tungsten (W), aluminum (Al), titanium (Ti), tantalum (Ta), gold (Au), silver (Ag), or a combination thereof, and the via portions 309, 313 and the line portion 311 are formed by an etching process and a subsequent deposition process. The etching process may include a wet etching process, a dry etching process, or a combination thereof, and the deposition process may include a CVD process, a PVD process, or an ALD process. After the deposition process, a planarization process may be performed, such as a CMP process.

Although the via portion 309 and the line portion 311 are shown as having distinguishable interface separating them from each other, when the via portion 309 and the line portion 311 are formed of the same or similar material, the via portion 309 and the line portion 311 may continuously connected with each other with no distinguishable interfaces therebetween. For example, the via portion 309 and the line portion 311 are simultaneously formed by filling a conductive material in a dual damascene opening.

Figure 24:
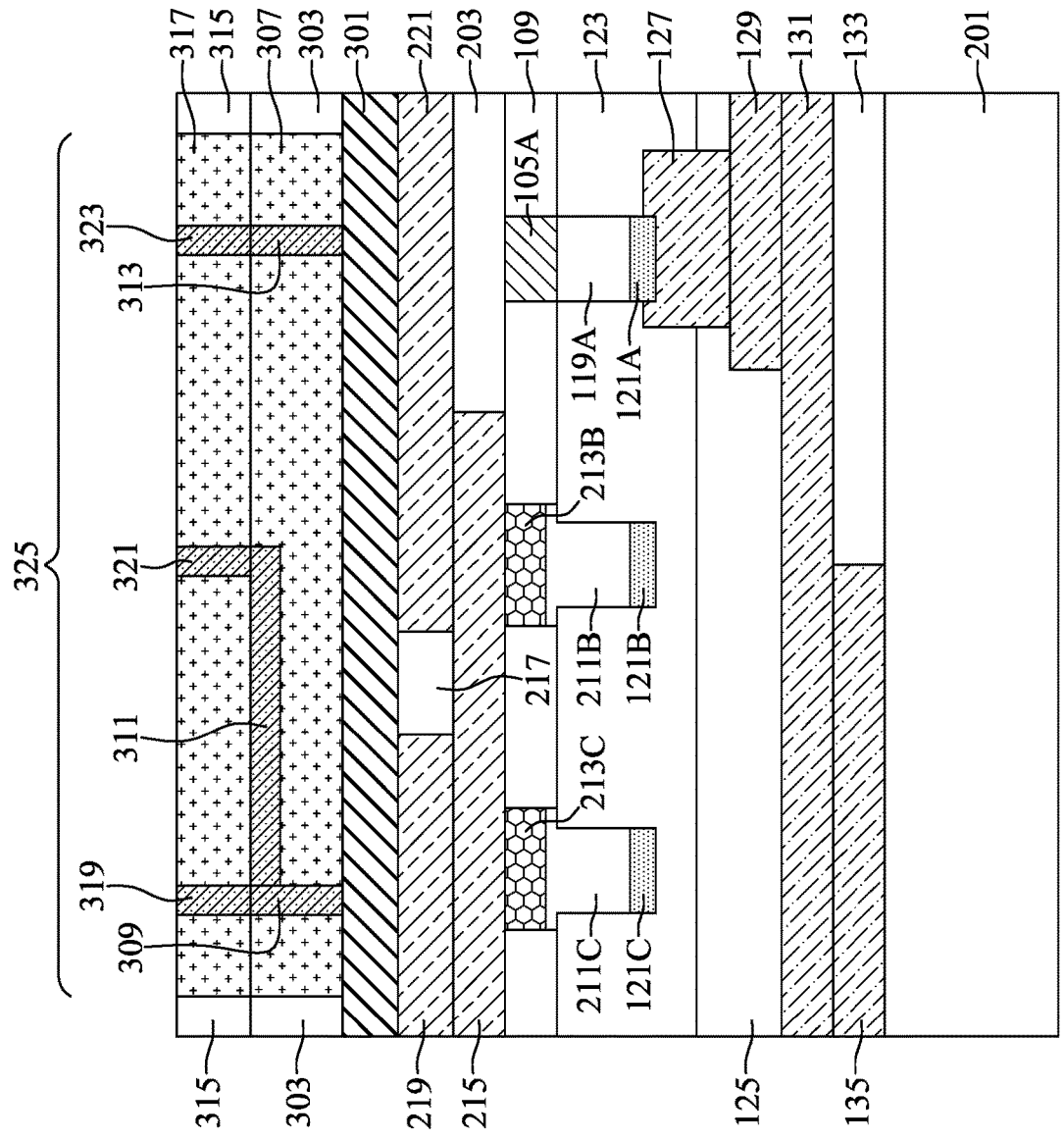
FIG. 24 is a cross-sectional view illustrating an intermediate stage of forming an upper portion of the passivation structure, an upper portion of the dielectric structure, and an upper portion of the interconnect frame during the formation of the semiconductor device, in accordance with some embodiments.

Then, an upper portion 315 of the passivation structure is formed over the lower portion 303 of the passivation structure, an upper portion 317 of the dielectric structure is formed over the lower portion 307 of the dielectric structure, and via portions 319, 321 and 323 are formed in the upper portion 317 of the dielectric structure, as shown in FIG. 24 in accordance with some embodiments. As a result, the dielectric structure is surrounded by the passivation structure, and an interconnect frame 325 including the via portions 309, 313, 319, 321, 323 and the line portion 311 is formed in the dielectric structure. The respective steps are illustrated as the sub-steps S33 and S35 in the step S25-1 shown in FIG. 4. Some materials used to form the upper portion 315 of the passivation structure, the upper portion 317 of the dielectric structure, and the via portions 319, 321 and 323 are similar to, or the same as those used to form the lower portion 303 of the passivation structure, the lower portion 307 of the dielectric structure, and the via portions 319 and 313, and details thereof are not repeated herein.

Referring back to FIG. 1, an upper redistribution layer 327 is formed over the dielectric structure and the passivation structure, in accordance with some embodiments. The respective step is illustrated as the sub-step S37 in the step S25-1 shown in FIG. 4. The upper redistribution layer 327 may include one or more dielectric portions (not shown) and one or more conductive portions (not shown), and the upper redistribution layer 327 may be formed by multiple deposition processes and multiple etching processes.

After the upper redistribution layer 327 is formed, the semiconductor device 100A with the interconnect part 300 is obtained. In some embodiments, the passivation structure including the lower portion 303 and the upper portion 315 is sandwiched between and in direct contact with the lower redistribution layer 301 and the upper redistribution layer 327. In some embodiments, the interconnect frame 325 is separated from the passivation structure by the dielectric structure. It should be noted that the interconnect frame 325 electrically connects the lower redistribution layer 301 and the upper redistribution layer 327.

FIGS. 25 to 29 illustrate intermediated stages of forming the semiconductor device 100B continued from FIG. 21, in accordance with some embodiments. The respective steps are illustrated as the sub-steps S41 to S 55 in the step S25-2 shown in FIG. 5.

Figure 25:
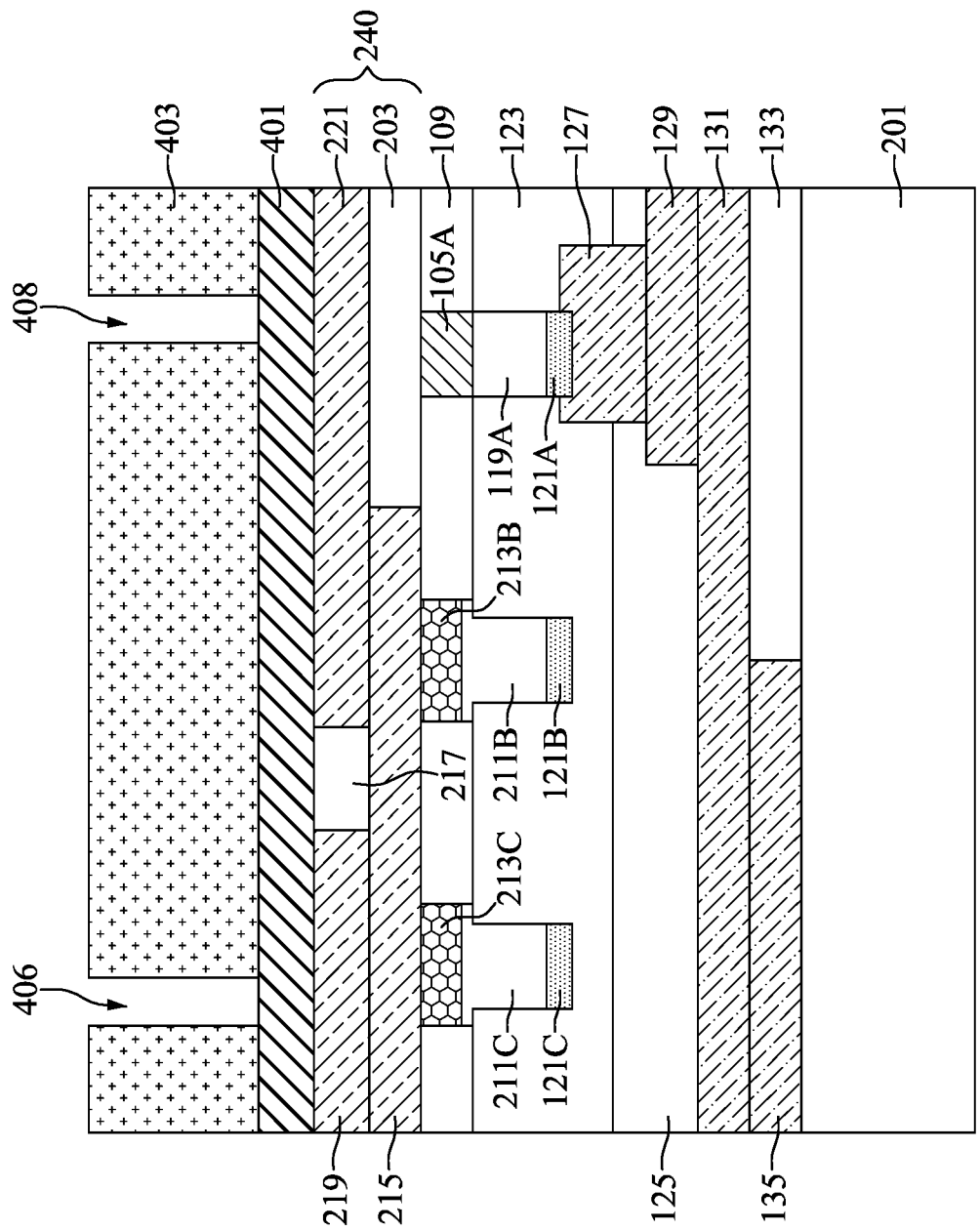
FIG. 25 is a cross-sectional view illustrating an intermediate stage of forming an energy removable layer with openings over the lower redistribution layer during the formation of the semiconductor device, in accordance with some embodiments.
Figure 26:
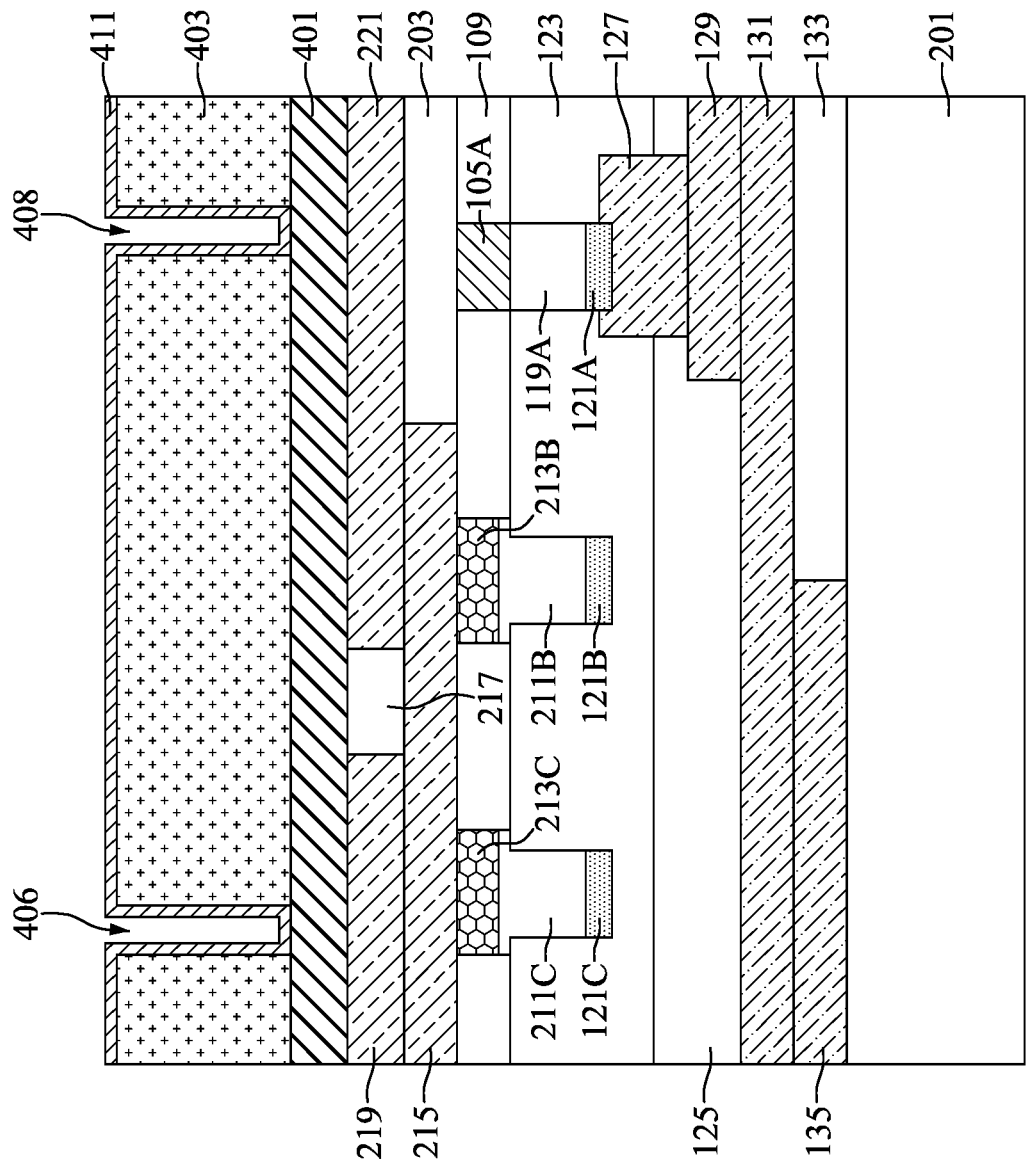
FIG. 26 is a cross-sectional view illustrating an intermediate stage of forming a passivation layer lining the openings and extending over the energy removable layer during the formation of the semiconductor device, in accordance with some embodiments.

After the redistribution structure 240 is formed, a lower redistribution layer 401 is formed over the redistribution structure 240, and an energy removable layer with openings 406 and 408 are formed over the lower redistribution layer 401, as shown in FIG. 25 in accordance with some embodiments. The respective steps are illustrated as the sub-steps S41, S43 and S45 in the step S25-2 shown in FIG. 5. The lower redistribution layer 401 may be similar to the lower redistribution layer 301 described above and the description is not repeated herein.

In some embodiments, the energy removable layer 403 includes a base material and a decomposable porogen material that is substantially removed once being exposed to an energy source (e.g., heat). In some embodiments, the base material includes hydrogen silsesquioxane (HSQ), methylsilsesquioxane (MSQ), porous polyarylether (PAE), porous SiLK, or porous silicon oxide (SiO2), and the decomposable porogen material includes a porogen organic compound, which can provide porosity to the spaces originally occupied by the energy removable layer 403 in the subsequent processes.

The energy removable layer 403 may be formed by a deposition process, such as a CVD process, a PVD process, or an ALD process. After the deposition process, portions of the energy removable layer 403 are removed by an etching process, such that the openings 406 and 408 exposing the lower redistribution layer 401 are obtained. The etching process may include a wet etching process, a dry etching process, or a combination thereof.

Subsequently, a passivation layer 411 is deposited lining the openings 406 and 408 and extending over the top surface of the energy removable layer 403. The respective step is illustrated as the sub-step S47 in the step S25-2 shown in FIG. 5. In some embodiments, the sidewalls of the openings 406, 408 and the bottom surfaces of the openings 406, 408 (i.e., the exposed surfaces of the lower redistribution layer 401) are covered by the passivation layer 411. In some embodiments, the passivation layer 411 is made of silicon oxide, silicon nitride, silicon oxynitride, and/or other suitable materials, and the deposition process for forming the passivation layer 411 includes a CVD process, a PVD process, or an ALD process.

Figure 27:
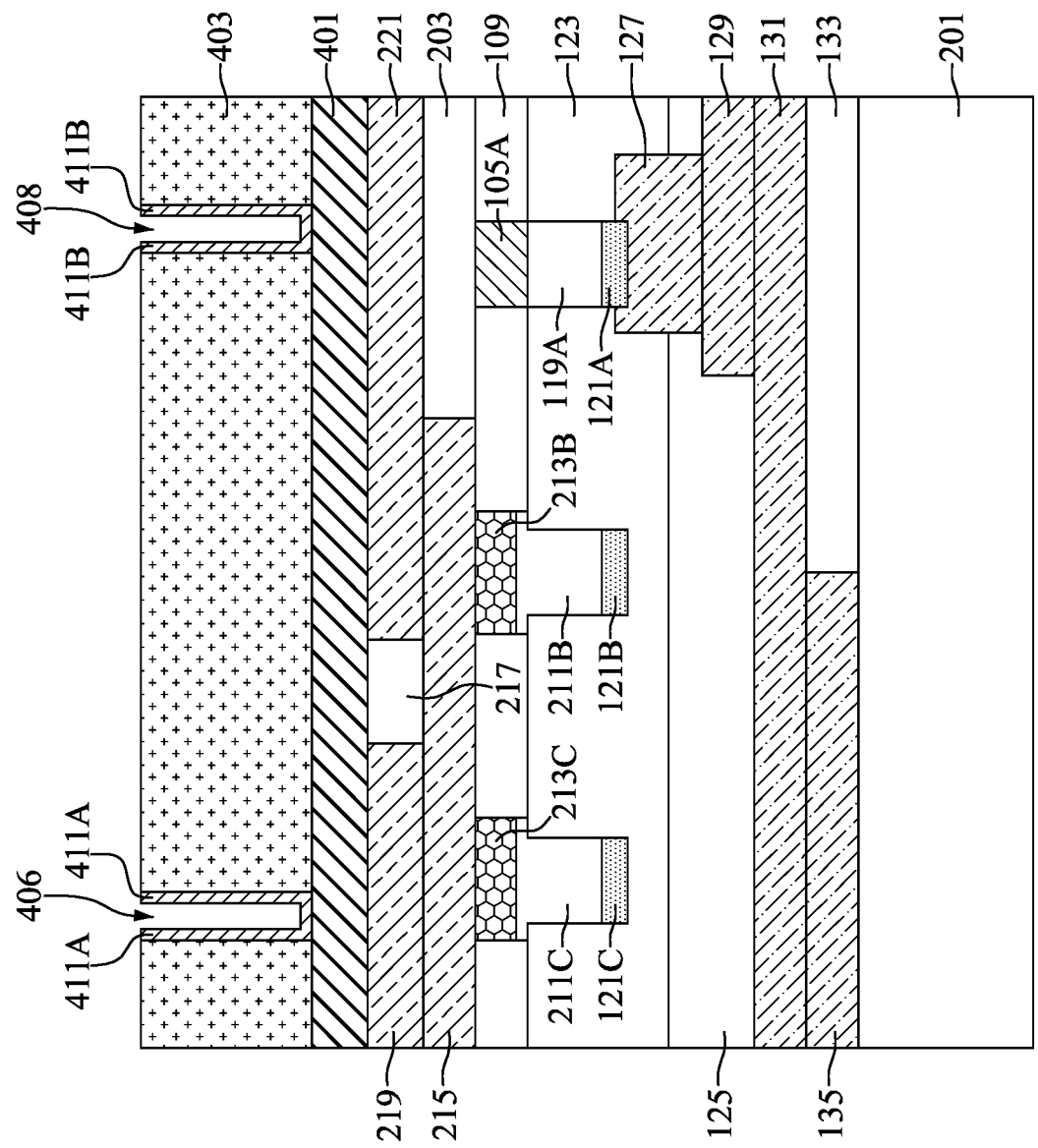
FIG. 27 is a cross-sectional view illustrating an intermediate stage of etching the passivation layer to form passivation liners on sidewalls of the openings during the formation of the semiconductor device, in accordance with some embodiments.

Next, the passivation layer 411 is etched to form passivation liners 411A and 411B on the sidewalls of the openings 406 and 408, as shown in FIG. 27 in accordance with some embodiments. The respective step is illustrated as the sub-step S49 in the step S25-2 shown in FIG. 5. In some embodiments, the etching process is an anisotropic etching process, which removes the same amount of the passivation layer 411 vertically in all places, leaving the passivation liners 411A and 411B on the sidewalls of the energy removable layer 403. In some embodiments, the etching process is a dry etching process.

Figure 28:
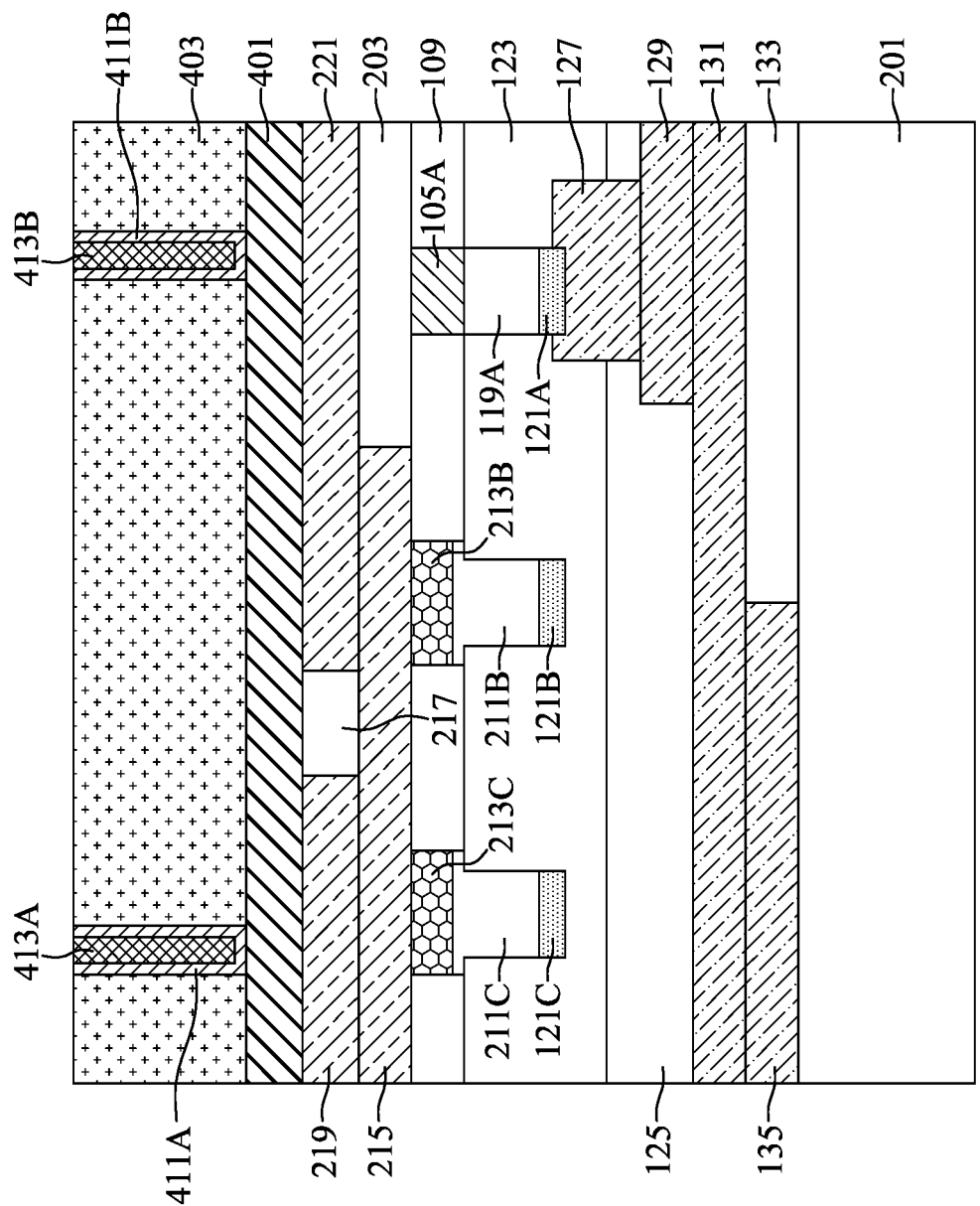
FIG. 28 is a cross-sectional view illustrating an intermediate stage of forming interconnect conductors in the openings during the formation of the semiconductor device, in accordance with some embodiments.

Then, interconnect conductors 413A and 413B are formed in the remaining portions of the openings 406 and 408, respectively, as shown in FIG. 28 in accordance with some embodiments. The respective step is illustrated as the sub-step S51 in the step S25-2 shown in FIG. 5. In some embodiments, the interconnect conductors 413A and 413B are made of a conductive material, such as copper (Cu), tungsten (W), aluminum (Al), titanium (Ti), tantalum (Ta), gold (Au), silver (Ag), or a combination thereof. In addition, the interconnect conductors 413A and 413B may be formed by a deposition process (e.g., CVD, PVC, or ALD), and a subsequent planarizing process (e.g., CMP).

Figure 29:
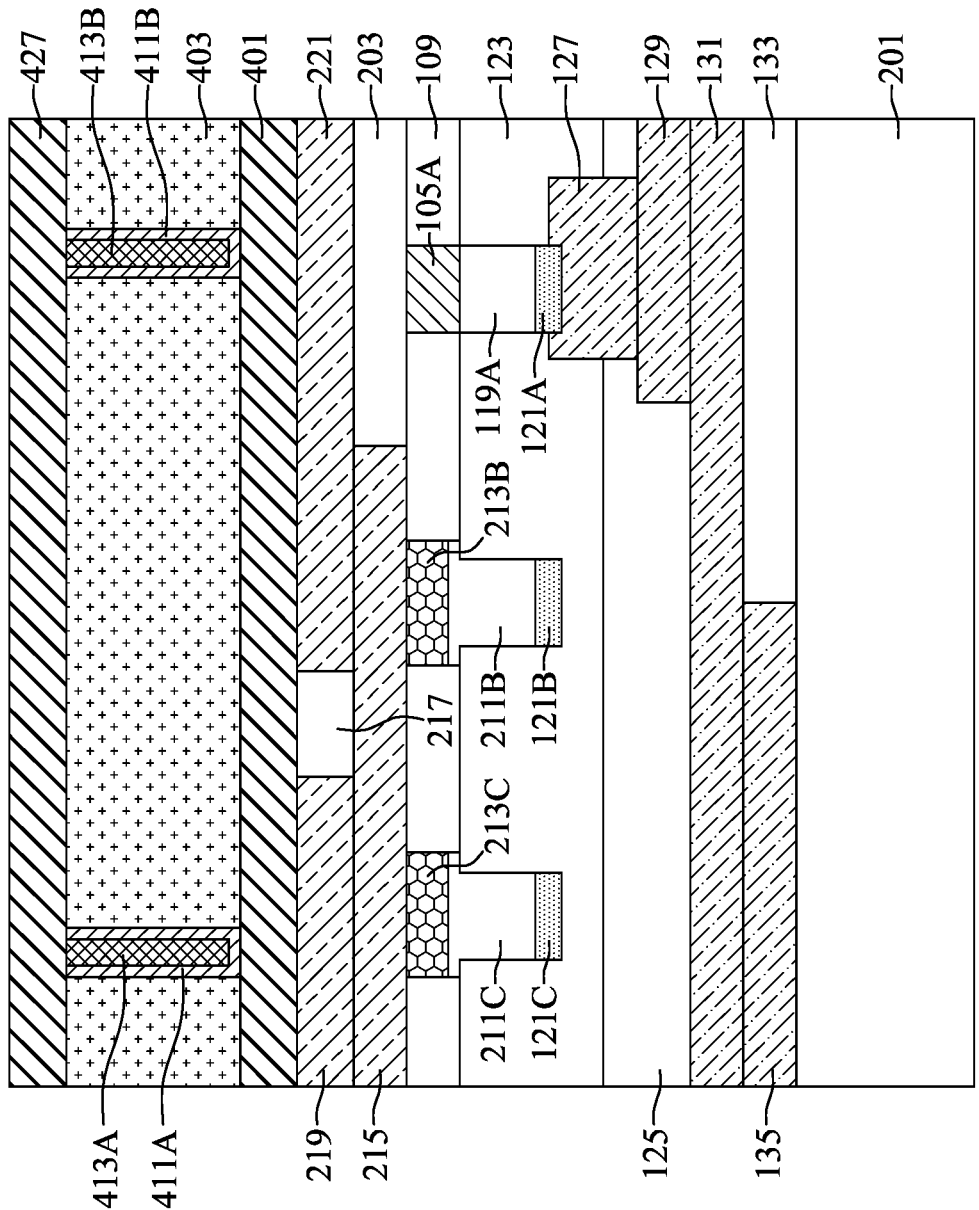
FIG. 29 is a cross-sectional view illustrating an intermediate stage of forming an upper redistribution layer over the energy removable layer during the formation of the semiconductor device, in accordance with some embodiments.

Subsequently, an upper redistribution layer 427 is formed over the energy removable layer 403, as shown in FIG. 29 in accordance with some embodiments. The respective step is illustrated as the sub-step S53 in the step S25-2 shown in FIG. 5. The upper redistribution layer 427 may include one or more dielectric portions (not shown) and one or more conductive portions (not shown), and the upper redistribution layer 427 may be formed by multiple deposition processes and multiple etching processes.

Referring back to FIG. 2, a heat treatment process is performed on the structure of FIG. 29 to transform the energy removable layer 403 into an air gap structure 430, in accordance with some embodiments. The respective step is illustrated as the sub-step S55 in the step S25-2 shown in FIG. 5. In some embodiments, the air gap structure 430 includes air gaps 430A, 430B and 430C. Although the air gaps 430A, 430B and 430C are separated from each other in the cross-sectional view of FIG. 2, the air gaps 430A, 430B and 430C may be physically connected in other cross-sectional views.

In some embodiments, the heat treatment process is used to remove the decomposable porogen materials of the energy removable layer 403 to generate pores, and the pores are filled by air after the decomposable porogen materials are removed, such that the air gap structures 430 is obtained, in accordance with some embodiments. In some other embodiments, the heat treatment process can be replaced by a light treatment process, an e-beam treatment process, a combination thereof, or another applicable energy treatment process. For example, an ultra-violet (UV) light or laser light may be used to remove the decomposable porogen materials of the energy removable layer 403, such that the air gap structure 430 is obtained. After the air gap structure 430 is formed, the semiconductor device 100B with the interconnect part 400 is obtained.

Embodiments of the semiconductor devices 100A and 100B and method for preparing the same are provided in the disclosure. In some embodiments, each of the semiconductor devices 100A and 100B includes a backside contact (e.g., the backside contact 213B and 213C) disposed over and electrically connected to a source/drain structure (e.g., the source/drain structure 211B and 211C), and an interconnect part (e.g., the interconnect part 300 of the semiconductor device 100A and the interconnect part 400 of the semiconductor device 100B) disposed over and electrically connected to the abovementioned backside contact. In some embodiments, the interconnect part includes an upper redistribution layer (e.g., the upper redistribution layer 327 of the semiconductor device 100A and the upper redistribution layer 427 of the semiconductor device 100B) disposed over a lower redistribution layer (e.g., the lower redistribution layer 301 of the semiconductor device 100A and the lower redistribution layer 401 of the semiconductor device 100B), and an interconnect structure (e.g., the interconnect frame 325 of the semiconductor device 100A and the interconnect conductors 413A, 413B of the semiconductor device 100B) disposed between and electrically connected to the lower redistribution layer and the upper redistribution layer. By forming the interconnect part over the backside contact, the BEOL routing is simplified. Accordingly, a modular design for implementing the interconnect part and the backside contact is achieved. In addition, the method for preparing the semiconductor device is simple and the fabrication cost and time of the semiconductor device is significantly reduced.

In one embodiment of the present disclosure, a semiconductor device is provided. The semiconductor device includes a first source/drain structure disposed over a carrier substrate, and a backside contact disposed over and electrically connected to the first source/drain structure. The semiconductor device also includes an interconnect part disposed over the backside contact. The interconnect part includes a lower redistribution layer electrically connected to the backside contact, and an upper redistribution layer disposed over the lower redistribution layer. The interconnect part also includes an interconnect frame disposed between and electrically connected to the lower redistribution layer and the upper redistribution layer. The interconnect part further includes a passivation structure surrounding the interconnect frame.

In another embodiment of the present disclosure, a semiconductor device is provided. The semiconductor device includes a first source/drain structure disposed over a carrier substrate, and a backside contact disposed over and electrically connected to the first source/drain structure. The semiconductor device also includes an interconnect part disposed over the backside contact. The interconnect part includes a lower redistribution layer electrically connected to the backside contact, and an upper redistribution layer disposed over the lower redistribution layer. The interconnect part also includes a first interconnect conductor and a second interconnect conductor extending in parallel between the lower redistribution layer and the upper redistribution layer. The lower redistribution layer and the upper redistribution layer are electrically connected by the first interconnect conductor and the second interconnect conductor. The interconnect part further includes a first passivation liner and a second passivation liner surrounding the first interconnect conductor and the second interconnect conductor, respectively.

In yet another embodiment of the present disclosure, a method for preparing a semiconductor device is provided. The method includes forming a sacrificial source/drain structure over a first carrier substrate, and forming a redistribution structure over the sacrificial source/drain structure. The method also includes attaching the redistribution structure to a second carrier substrate, and removing the first carrier substrate after the redistribution structure is attached to the second carrier substrate. The method further includes replacing the sacrificial source/drain structure with a first source/drain structure, and forming a backside contact over and electrically connected to the first source/drain structure. In addition, the method includes forming an interconnect part over the backside contact. The step of forming the interconnect part includes forming a lower redistribution layer electrically connected to the backside contact, forming an interconnect structure over and electrically connected to the lower redistribution layer, and forming an upper redistribution layer over and electrically connected to the interconnect structure.

The embodiments of the present disclosure have some advantageous features. By forming an interconnect part over a backside contact electrically connected to a source/drain structure, the BEOL routing is simplified. Accordingly, a modular design is achieved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
   forming a sacrificial source/drain structure over a first carrier substrate;
   forming a redistribution structure over the sacrificial source/drain structure;
   attaching the redistribution structure to a second carrier substrate;
   removing the first carrier substrate after the redistribution structure is attached to the second carrier substrate;
   replacing the sacrificial source/drain structure with a first source/drain structure;
   forming a backside contact over and electrically connected to the first source/drain structure;
   forming an interconnect part over the backside contact, wherein the step of forming the interconnect part comprises:
      forming a lower redistribution layer electrically connected to the backside contact;
      forming an interconnect structure over and electrically connected to the lower redistribution layer; and
      forming an upper redistribution layer over and electrically connected to the interconnect structure;
   forming a second source/drain structure between the upper redistribution layer of the interconnect part and the second carrier substrate; and
   forming a frontside contact between the second source/drain structure and the second carrier substrate, wherein the second source/drain structure is electrically connected to the second carrier substrate through the frontside contact, wherein a top surface of the first source/drain structure is higher than a top surface of the second source drain structure.

2. The method for preparing a semiconductor device of claim 1, further comprising:
   forming the redistribution structure over and electrically connected to the frontside contact, wherein the redistribution structure is disposed between the backside contact and the lower redistribution layer of the interconnect part.

3. The method for preparing a semiconductor device of claim 2, wherein the first source/drain structure is electrically connected to the lower redistribution layer through the redistribution structure, wherein the second source/drain structure is electrically isolated from the redistribution structure.

4. The method for preparing a semiconductor device of claim 1, wherein the step of forming the interconnect structure of the interconnect part comprises:
   forming a passivation structure and a dielectric structure over the lower redistribution layer, wherein the dielectric structure is surrounded by the passivation structure; and
   forming an interconnect frame in the dielectric structure.

5. The method for preparing a semiconductor device of claim 1, wherein the step of forming the interconnect structure of the interconnect part comprises:
   forming an energy removable layer over the lower redistribution layer;

etching the energy removable layer to form a first opening and a second opening exposing the lower redistribution layer;

forming a first passivation liner and a second passivation liner on sidewalls of the first opening and sidewalls of the second opening, respectively; and forming a first interconnect conductor in the first opening and surrounded by the first passivation liner and a second interconnect conductor in the second opening and surrounded by the second passivation liner.

6. The method for preparing a semiconductor device of claim 5, further comprising:

performing a heat treatment process to transform the energy removable layer into an air gap structure after the upper redistribution layer is formed.

* * * * *